(12) United States Patent  (10) Patent No.: US 8,237,331 B2
Nagaoka et al.  (45) Date of Patent: Aug. 7, 2012

(54) VIBRATORY ACTUATOR AND DRIVE UNIT INCLUDING THE SAME

(75) Inventors: Eiichi Nagaoka, Hyogo (JP); Yusuke Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 48 days.

(21) Appl. No.: 12/664,115

(22) PCT Filed: Jun. 13, 2008

(86) PCT No.: PCT/JP2008/001534
§ 371 (c)(1),
(2), (4) Date: Dec. 11, 2009

(87) PCT Pub. No.: WO2008/152821
PCT Pub. Date: Dec. 18, 2008

(65) Prior Publication Data
US 2010/0181870 A1  Jul. 22, 2010

(30) Foreign Application Priority Data
Jun. 14, 2007  (JP) ................................. 2007-157154

(51) Int. Cl.
*H02N 2/04* (2006.01)

(52) U.S. Cl. ......... 310/323.16; 310/323.01; 310/323.04; 310/323.13

(58) Field of Classification Search ............ 310/323.01–323.21, 328
See application file for complete search history.

(56) References Cited

U.S. PATENT DOCUMENTS

| 2003/0234596 A1* | 12/2003 | Johansson et al. ............ 310/328 |
| 2005/0073217 A1* | 4/2005 | Sasaki et al. ............. 310/323.09 |
| 2006/0238072 A1* | 10/2006 | Funakubo ................ 310/323.16 |

FOREIGN PATENT DOCUMENTS

| JP | 2001-086775 | 3/2001 |
| JP | 2001-157474 | 6/2001 |
| JP | 2001-224186 | 8/2001 |
| JP | 2004-297910 | 10/2004 |
| JP | 2004-304963 | 10/2004 |
| JP | 2008-253068 | 10/2008 |

OTHER PUBLICATIONS

International Search Report for corresponding Application No. PCT/JP2008/001534 mailed Jul. 22, 2008.
Form PCT/ISA/237 for International Application No. PCT/JP2008/001534 mailed Jul. 22, 2008.

* cited by examiner

*Primary Examiner* — Derek Rosenau
(74) *Attorney, Agent, or Firm* — Renner, Otto, Boisselle & Sklar, LLP

(57) ABSTRACT

The drive efficiency of a vibratory actuator is improved without increasing a weight of a driver element.
An ultrasonic actuator (2) includes an actuator body (4) for generating longitudinal vibration and bending vibration, and driver elements (8), provided on a mounting surface (40a) which is one of side surfaces of the actuator body (4), for making an orbit motion according to the vibrations of the actuator body (4) to output driving force. In the driver element (8), a through hole (80) is provided.

17 Claims, 17 Drawing Sheets

VIBRATORY ACTUATOR AND DRIVE UNIT INCLUDING THE SAME

TECHNICAL FIELD

Conventionally, as a vibratory actuator including a piezoelectric element, an actuator disclosed in Patent Document 1 has been known.

The vibratory actuator according to Patent Document 1 includes an actuator body formed of a piezoelectric element, and a driver element attached to the actuator body.

The actuator body is formed of a flat plate-shaped piezoelectric element having a longitudinal direction. In the actuator body, longitudinal vibration (so-called expanding/contracting vibration) along the longitudinal direction of the piezoelectric element and bending vibration along a lateral direction of the piezoelectric element are induced in a cooperated manner by respectively applying alternating currents having different phases to two electrode pairs each of which includes two electrodes diagonally arranged. As a result, the driver element makes an orbit motion, more specifically, an elliptical motion in a plane of the piezoelectric element including a longitudinal direction and a lateral direction.

The driver element is formed to have a hemispherical shape, and two such driver elements are provided on a long side surface of the actuator body. The long side surface is a surface facing in a direction of bending vibration of the actuator body, and is a surface which is bendingly deformed according to bending vibration when the actuator body undergoes bending vibration. In other words, the long side surface is a rippling surface. The two driver elements are respectively attached to parts of the long side surface corresponding to antinodes of bending vibration where bending displacement is maximum.

The vibratory actuator configured in the above-described manner is placed between a fixed body and a movable body placed to be movable relatively to the fixed body. Specifically, the vibratory actuator is provided so that the driver elements abut on one (hereinafter referred to as an "abutment body") of the fixed body and the movable body and are fixed to the other one of the fixed body and the movable body. In this state, when the vibratory actuator is operated to cause each of the driver elements to make an orbit motion in the above-described manner, each of the driving elements makes an orbit motion with increased friction force while pressing the abutment body in a zone where the orbit motion takes place, and the driver element makes an orbit motion while being spaced apart from the abutment body or with reduced friction force in another zone where the orbit motion does not take place. When each of the driving elements makes an orbit motion while pressing the abutment body, driving force is transmitted to the movable body through friction force between the driver elements and the abutment body to drive the movable body along a predetermined direction.

CITATION LIST

Patent Document

PATENT DOCUMENT 1: Japanese Patent Application No. 2004-304963

SUMMARY OF THE INVENTION

Technical Problem

As described above, in the vibratory actuator in which driving force is given to the movable body through friction force between each of the driver elements making an orbit motion according to vibration of the actuator body and the abutment body on which the driver elements abut, as displacement of an abutting portion of each of the driver elements abutting on the abutment body is amplified, larger driving force can be applied to the movable body. Presumably, with the driver elements having an increased outer circumference, a distance between an attached area of each of the driver elements attached to the actuator body and the abutting portion of the driver element (a part of the driver element abutting to the abutment body) is increased, and therefore, the displacement of the abutting portion of the driver element is amplified. However, even when the size of the driver elements is increased, large driving force cannot always be given to the movable body.

In view of the above-described points, the present invention has been devised, and it is therefore an object of the present invention to allow for application of larger driving force to a movable body to improve the drive efficiency of a vibratory actuator.

Solution to the Problem

To achieve this object, according to the present invention, a reduced-material portion is provided in a driver element to adjust a resonance frequency of leaning vibration of the driver element. Here, the term "leaning vibration of a driver element" means vibration of a driver element along a direction in which driving power is output, with an attached area of the driver element attached to an actuator body serving as the center of vibration.

Specifically, an vibratory actuator according to the present invention includes: an actuator body, formed of a piezoelectric element or formed to include a piezoelectric element, for generating a plurality of vibrations having different vibration directions; and a driver element, provided on a mounting surface which is one of side surfaces of the actuator body, for making an orbit motion according to the vibrations of the actuator body to output driving force, and a reduced-material portion is provided in the driver element. The term "reduced-material portion" used herein means a part (or a state) in which a certain portion of a material is removed so that the amount of the material is smaller than that in other parts. It does not matter whether the amount of the material in the reduced-material portion is reduced from its original amount by additional processing such as cutting or the like, or whether the reduced-material portion is configured to have a reduced amount already at a time when it is formed by casting or the like.

A drive unit according to the present invention includes: a fixed body and a movable body capable of relative displacement; and the above-described vibratory actuator provided between the fixed body and the movable body. The vibratory actuator is configured so that the driver element abuts on one of the fixed body and the movable body and is placed on the other one of the fixed body and the movable body.

Advantages of the Invention

According to the present invention, a reduced-material portion is provided in a driver element to adjust the weight of the driver element, so that the resonance frequency of leaning vibration of the driver element can be controlled. Thus, the phase of leaning vibration of the driver element can be caused to be close to (or, preferably matched with) the phase of vibration of the actuator body. Therefore, displacement of an abutting area of the driver element abutting on an abutment body can be amplified in the same direction as direction of the displacement of an attached area of the driver element to be larger than the displacement of the attached area. As a result, the driving efficiency can be improved.

BRIEF DESCRIPTION OF THE DRAWINGS

FIG. 9(a) shows a state before the stage is driven. FIG. 9(b) shows a state where the actuator body expands along the longitudinal direction and thereby one of driver elements drives a stage. FIG. 9(c) shows a state where the actuator body contracts along the longitudinal direction and thereby the other one of the driver elements drives the stage.

Figure 1:
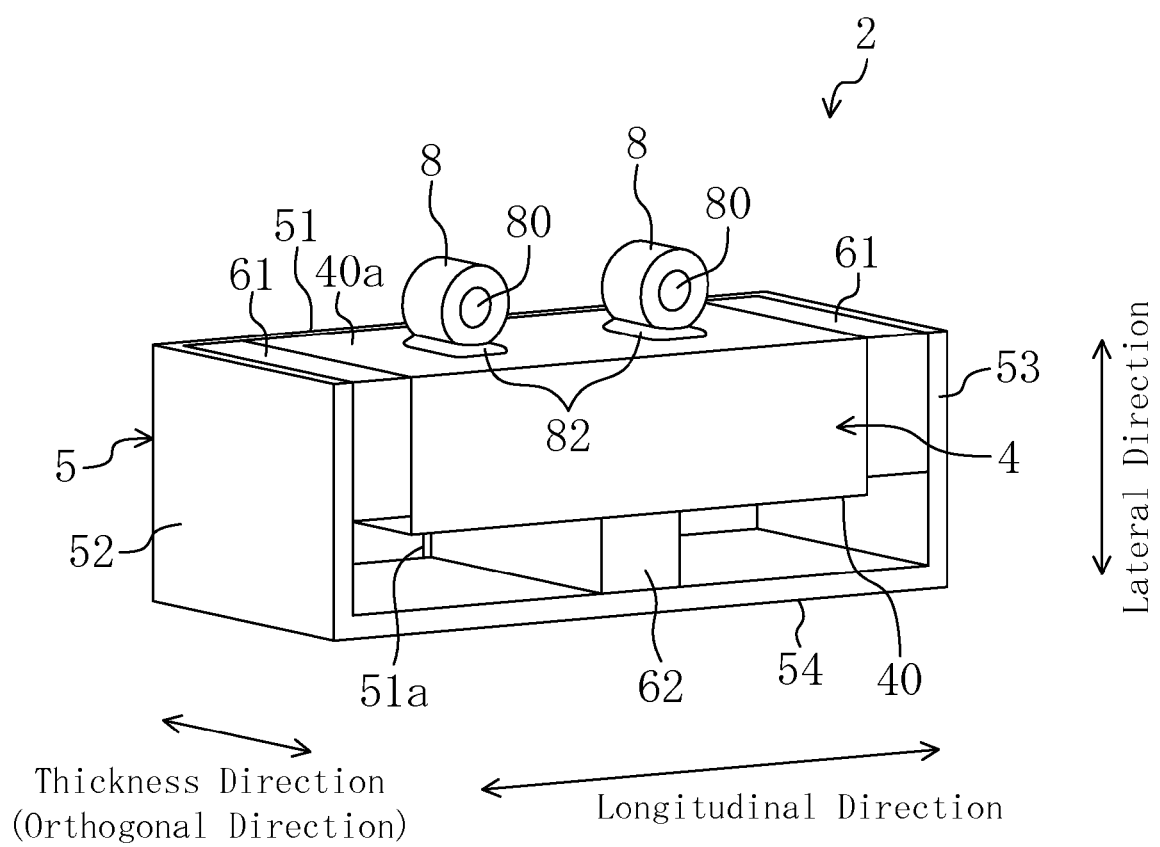
FIG. 1 is a perspective view of an ultrasonic actuator according to Embodiment 1.

DESCRIPTION OF REFERENCE CHARACTERS 1, 801, 901, 101 Drive unit
11 Stage (movable body)
2 Ultrasonic actuator (vibratory actuator)
4 Actuator body
40a Long side surface (mounting surface)
40b Short side surface (mounting surface)
8, 208, 308, 408, 508, 508b, 608, 708 Driver element
80, 280, 380, 580, 780 Through hole (reduced-material portion)
480 Concave portion (reduced-material portion)
680 Notch portion (reduced-material portion)
83 Circular body
84 Vibration absorbing member
85 Absorbing member

DESCRIPTION OF EMBODIMENTS

Embodiments of the present invention will be described hereinafter in detail with reference to the accompanying drawings.

Embodiment 1

Figure 2:
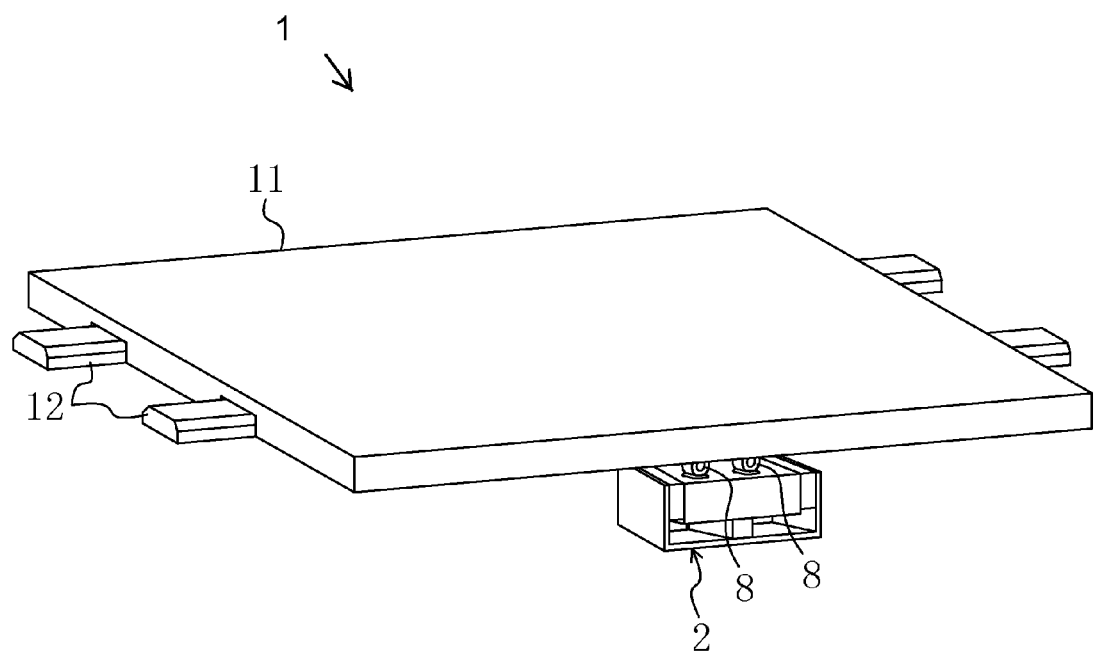
FIG. 2 is a perspective view of a drive unit.

As shown in FIG. 2, a drive unit 1 according to Embodiment 1 of the present invention includes a stage 11, an ultrasonic actuator 2, and a control unit (not shown) for performing drive control of the ultrasonic actuator 2.

The stage 11 is attached to guides 12, fixed on a base (not shown) as a fixed body in parallel to one another, so as to be capable of sliding. That is, the stage 11 is configured so as to be movable along a direction in which the guides 12 extend. The stage 11 forms a movable body. The direction in which the guides 12 extend is a moving direction of the stage 11. The stage 11 is a flat plate member having an approximately square shape when viewed from the top, and is formed of alumina. The material of the stage 11 is not limited to alumina, but the stage 11 may be formed of any material. The ultrasonic actuator 2 is placed so that driver elements 8, which will be described later, abut on a back surface of the stage 11 (on which the guides 12 are provided).

As shown in FIG. 1, the ultrasonic actuator 2 includes an actuator body 4 for generating vibration, driver elements 8 for transmitting driving force of the actuator body 4 to the stage 11, a case 5 for housing the actuator body 4, support rubbers 61, provided between the actuator body 4 and the case 5, for elastically supporting the actuator body 4, and a bias rubber 62 for biasing the actuator body 4 to the stage 11. The ultrasonic actuator 2 forms a vibratory actuator (the same applies to each embodiment described below).

The actuator body 4 is formed of a piezoelectric element unit 40.

The piezoelectric element unit 40 has an approximately rectangular parallelepiped shape including a pair of principal surfaces each having an approximately rectangular shape and being opposed to one another, a pair of long side surfaces each being perpendicular to each of the principal surfaces, extending along longitudinal directions of the principal surfaces and being opposed to one another, and a pair of short side surfaces each being perpendicular to each of the principal surfaces and the long side surfaces, extending along lateral directions of the principal surfaces and being opposed to one another.

Figure 3:
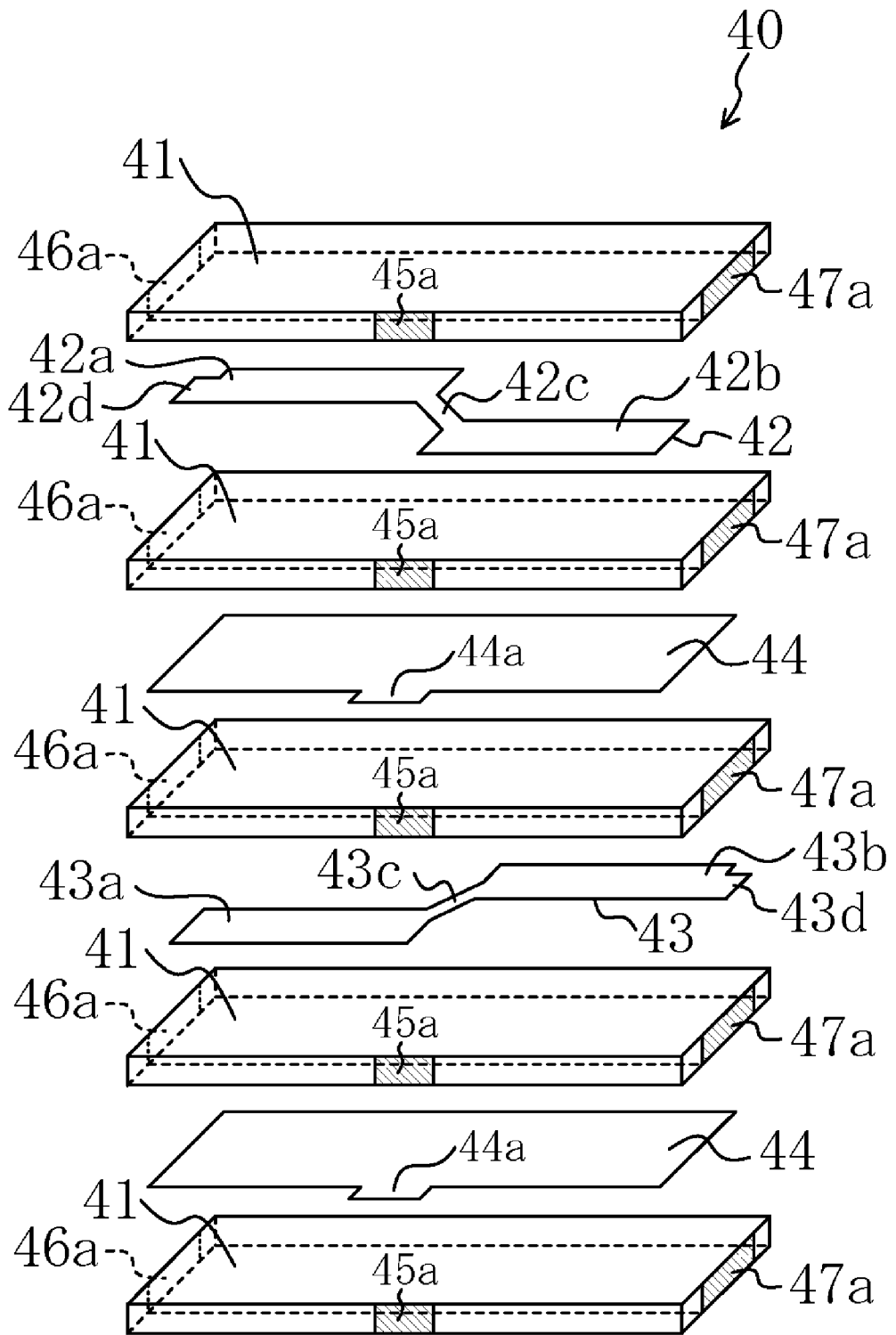
FIG. 3 is an exploded perspective view of a piezoelectric element unit.

As shown in FIG. 3, the piezoelectric element unit 40 includes five piezoelectric element layers (piezoelectric elements) 41 and four internal electrode layers 42, 44, 43 and 44, which are alternately stacked. Specifically, the internal electrode layers 42, 44, 43 and 44 are, respectively, formed of a first power supply electrode layer 42, a common electrode layer 44, a second power supply electrode layer 43 and another common electrode layer 44 which are alternately provided in a stacking direction with each of the piezoelectric element layers 41 interposed between any two of the internal electrode layers. Each of the first power supply electrode layer 42, the second power supply electrode layer 43, and the common electrode layers 44 is printed on a principal surface of an associated one of the piezoelectric element layers 41.

Each of the piezoelectric element layers 41 is an insulation layer, for example, formed of a ceramic material such as lead zirconate titanate and has an approximately rectangular parallelepiped shape including a pair of principal surfaces, a pair of long side surfaces and a pair of short side surfaces in the same manner as the piezoelectric element unit 40. Moreover, an external electrode 45a is formed in a center part of one of the long side surfaces in the longitudinal direction, an external electrode 46a is formed in a center part of one of the short side surfaces in the lateral direction, and an external electrode 47a is formed in a center part of the other one of the short side surfaces in the lateral direction.

Each of the common electrode layers 44 has an approximately rectangular shape provided on an approximately entire principal surface of an associated one of the piezoelectric element layers 41. Moreover, a lead electrode 44a is formed in one of long side portions of each of the common electrode layers 44 so as to extend from a center part of the common electrode layer 44 in the longitudinal direction thereof to the external electrode 45a of the piezoelectric element layer 41.

Figure 4:
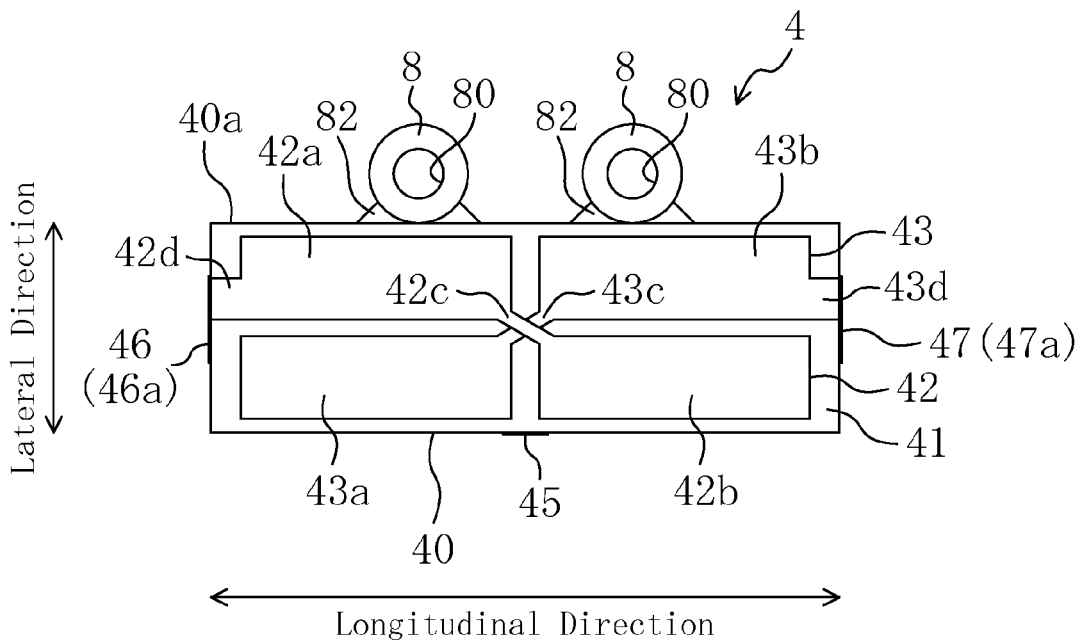
FIG. 4 is a schematic front view illustrating a configuration of an actuator body.

Suppose that the principle surface of each of the piezoelectric element layers 41 is divided in four areas, i.e., two areas in the longitudinal direction and two areas in the lateral direction. As shown in FIG. 4, the first power supply electrode layer 42 includes first electrodes 42a and 42b respectively formed in one pair of the areas located in one diagonal direction of the principal surface, and a conductive electrode 42c for connecting the first electrodes 42a and 42b to bring them in conduction. Each first electrode 42a (42b) is an electrode having an approximately rectangular shape and overlaps with the common electrode layers 44 when viewed in the stacking direction. That is, each first electrode 42a (42b) is opposed to an associated one of the common electrode layers 44 with an associated one of the piezoelectric element layers 41 interposed therebetween. One of the first electrodes 42a and 42b, i.e., the first electrode 42a is provided with a lead electrode 42d extending to the external electrode 46a of the piezoelectric element layer 41.

The second power supply electrode layer 43 includes a pair of second electrodes 43a and 43b respectively formed in the other pair of the areas located in the other diagonal direction of the principal surface, and a conductive electrode 43c for connecting the second electrodes 43a and 43b to bring them in conduction. When viewed in the stacking direction, the second electrode 43a is provided in one area of the other pair, which is located adjacent to the first electrode 42a in the lateral direction and adjacent to the first electrode 42b in the longitudinal direction, and the second electrode 43b is provided in the other area of the same pair, which is located adjacent to the first electrode 42a in the longitudinal direction and adjacent to the first electrode 42b in the lateral direction. Each second electrode 43a (43b) is an electrode having an approximately rectangular shape and overlaps with the common electrode layers 44, when viewed in the stacking direction. That is, each second electrode 43a (43b) is opposed to an associated one of the common electrode layers 44 with an associated one of the piezoelectric element layers 41 interposed therebetween. Moreover, one of the second electrodes 43a and 43b, i.e., the second electrode 43b is provided with a lead electrode 43d extending to the external electrode 47a of the piezoelectric element layer 41.

In the piezoelectric element unit 40 formed by alternately stacking the piezoelectric element layers 41 and the internal electrode layers 42, 44, 43 and 44, the respective external electrodes 45a of the piezoelectric element layers 41 align in the stacking direction in a center part of one long side surface of the piezoelectric element unit 40 in the longitudinal direction, thereby forming an integrated external electrode 45. The lead electrodes 44a provided to the common electrode layers 44 are electrically connected to the integrated external electrode 45. In the same manner, the respective external electrodes 46a of the piezoelectric element layers 41 align in the stacking direction in a center part of one short side surface of the piezoelectric element unit 40 in the lateral direction, thereby forming an integrated external electrode 46. The lead electrode 42d of the first power supply electrode layer 42 is electrically connected to the integrated external electrode 46. Furthermore, the respective external electrode 47a of the piezoelectric element layers 41 align in the stacking direction in a center part of the other short side surface of the piezoelectric element unit 40 in the lateral direction, thereby forming an integrated external electrode 47. The lead electrode 43d of the second power supply electrode layer 43 is electrically connected to the integrated external electrode 47.

On the other long side surface (specifically, one of the pair of surfaces facing in a vibration direction of bending vibration which will be described later and will hereinafter be also referred to as a "mounting surface") of the piezoelectric element unit 40 in which the external electrodes 45a are not provided, two driver elements 8 are provided.

The driver elements 8 are circular column shaped members each of which has a concentric through hole 80 extending along an axis direction, i.e., cylindrical members, and are formed of zirconia, alumina, silicon nitride, silicon carbide, tungsten carbide, or the like. The through hole 80 forms a reduced-material portion.

Each of the driver elements 8 is provided on the mounting surface 40a so that an axis direction of the driver element 8 corresponds to a thickness direction of the piezoelectric element unit 40 (this direction is also referred hereinafter to as an "orthogonal direction"). The orthogonal direction is a stacking direction of the piezoelectric element unit 40, and also a direction orthogonal to a plane in which each of the driver elements 8 makes an orbit motion which is to be described later. The orthogonal direction is also a direction orthogonal to each of respective vibration directions of bending vibration and longitudinal vibration of the piezoelectric element unit 40 which is to be described later.

Figure 5:
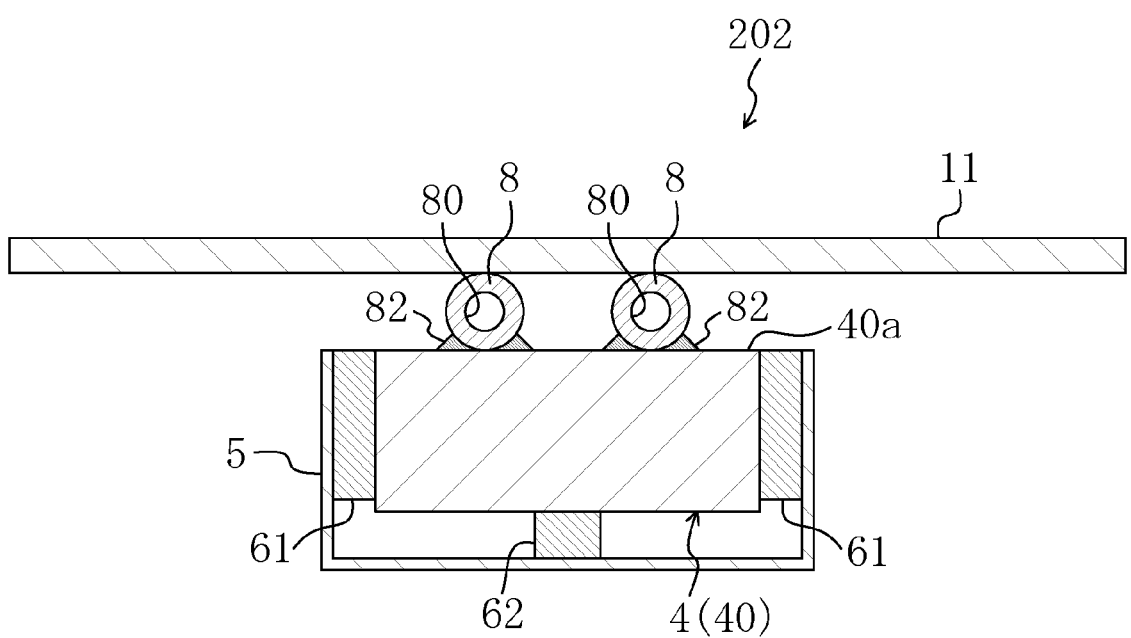
FIG. 5 is a cross-sectional view of an ultrasonic actuator.

As shown in FIG. 5, the driver elements 8 are attached to the mounting surface 40a by an adhesive bond 82 so as to be in line contact with the mounting surface 40a. The term "line contact" is used herein to describe not only a state where the driver elements 8 are in contact with the mounting surface 40a in a strict sense, but also a state where the driver elements 8 are substantially in line contact with the mounting surface 40a with the adhesive bond 82 interposed between each of the driver elements 8 and the mounting surface 40a. The term "circular column shape" refers to not only a circular column shape in a strict mean, but also a substantially circular column shape which allows the driver elements 8 to be in an approximate line contact with the mounting surface 40a.

The adhesive bond 82 is preferably formed of a softer material than respective materials of the piezoelectric element unit 40 and the driver elements 8. Specifically, examples materials include synthetic resin, particularly, epoxy resin and silicone resin. The use of such materials allows the driver elements 8 to be reliably fixed with the mounting surface 40a while minimizing damping of vibration of the piezoelectric element unit 40, which will be described later.

Moreover, the driver elements 8 are provided in parts of the mounting surface 40a located at a distance of 30% to 35% of the full length of the mounting surface 40a inwardly from both ends in the longitudinal direction of the piezoelectric element unit 40, respectively. That is, each of the locations of the driver elements 8 corresponds to an antinode of a second-order mode of bending vibration of the piezoelectric element unit 40 where vibration is maximum, which will be described later.

In the actuator body 4 configured in the above-described manner, the external electrode 45 is connected to the ground, an alternating voltage at a predetermined frequency is applied to the external electrode 46, and an alternating voltage of a phase shifted from the phase of the alternating voltage by 90° is applied to the external electrode 47. Thus, alternating voltages which have different phases from one another by 90° are applied to the one pair of the first electrodes 42a and 42b and the other pair of the second electrode 43a and 43b, respectively, each of which is located in an associated one of the diagonal directions of the principal surface of each piezoelectric element layer 41, so that longitudinal vibration (i.e., so-called expanding/contracting vibration) along the longitudinal direction of the actuator body 4 and bending vibration (i.e., so-called lateral vibration) along the lateral direction of the actuator body 4 are induced.

Figure 6:
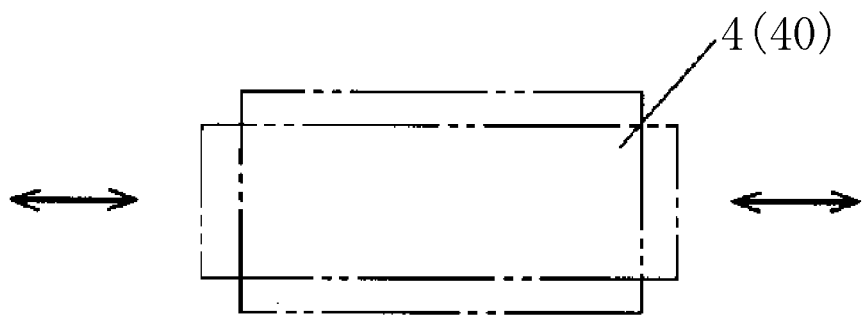
FIG. 6 is a conceptual diagram illustrating displacement made by a first-order mode of longitudinal vibration of an actuator body along a longitudinal direction.
Figure 7:
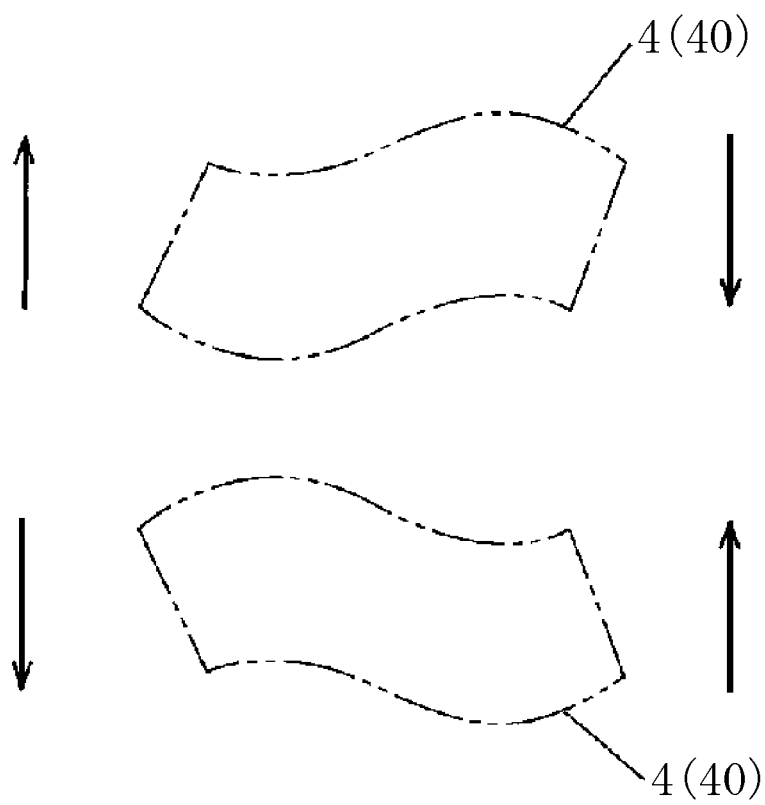
FIG. 7 is a conceptual diagram illustrating displacement made by a second-order mode of bending vibration of the actuator body.
Figure 8:
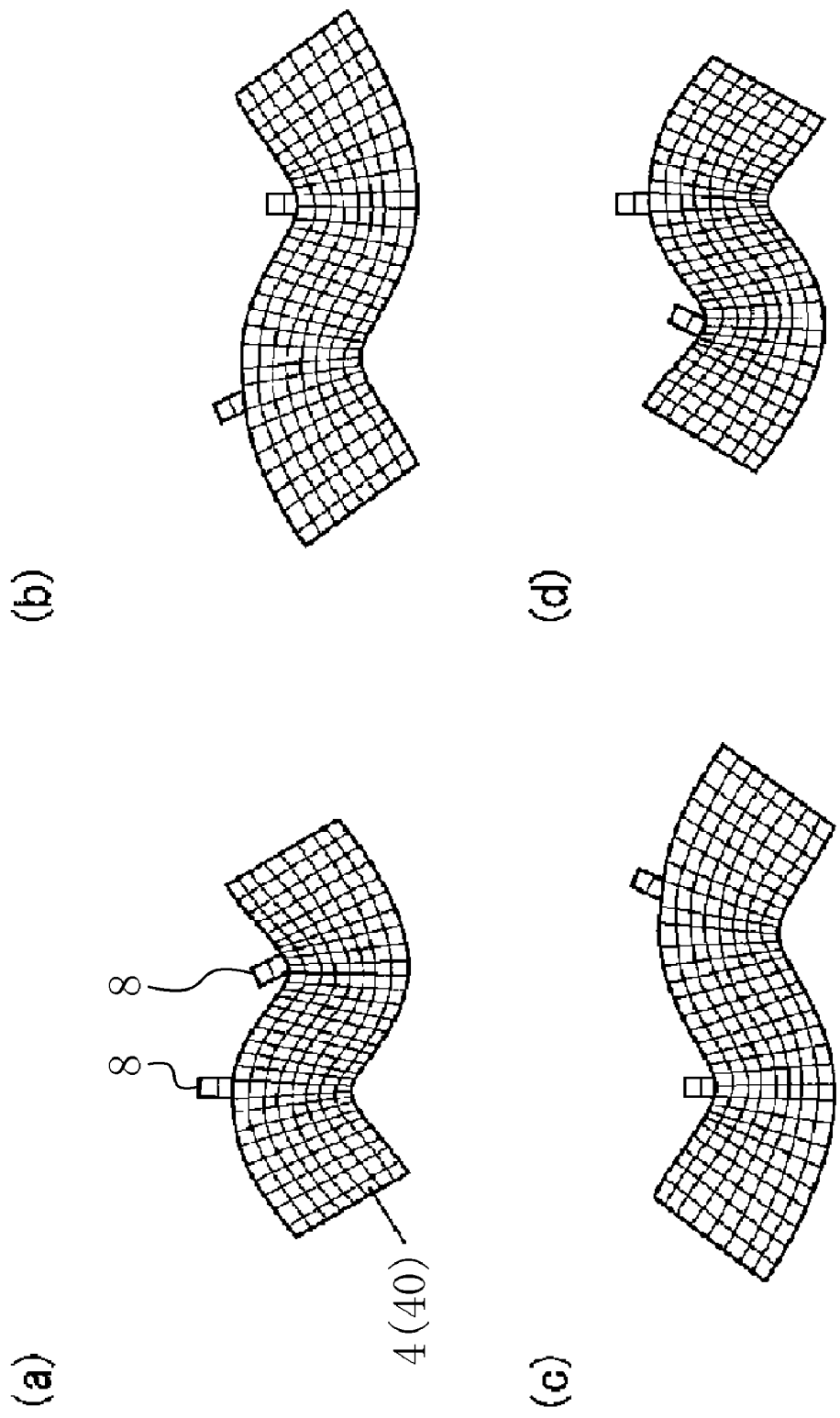
FIGS. 8(a)-8(d) are conceptual diagrams illustrating the operation of the actuator body.

Respective resonance frequencies of longitudinal vibration and bending vibration are determined by a material, a shape and the like of the actuator body 4, i.e., the piezoelectric element unit 40. Furthermore, both of the resonance frequencies are influenced by force supporting the actuator body 4 and a position where the actuator body 4 is supported. Considering this, the resonance frequencies are substantially matched to one another, and alternating voltages having a frequency around the resonance frequencies and phases shifted from one another by 90° are applied to the external electrodes 46 and 47, respectively. For example, with the piezoelectric element unit 40 designed to have a shape or the like which allows the respective resonance frequencies of a first-order mode of longitudinal vibration (see FIG. 6) and a second-order mode of bending vibration (see FIG. 7) to be matched to one another, alternating voltages having a frequency around the resonance frequencies and phases shifted from one another by 90° are applied. Thus, the first-order mode of longitudinal vibration and the second-order mode of bending vibration are harmonically induced in the piezoelectric element unit 40, so that the piezoelectric element unit 40 changes itself into shapes shown in FIGS. 8(*a*), 8(*b*), 8(*c*) and 8(*d*) in this order.

As a result, each of the driver elements 8 provided to the piezoelectric element unit 40 makes an approximately elliptical motion, i.e., an orbit motion in a plane parallel to a principal surface of the piezoelectric element unit 40 (i.e., a plane parallel to the drawing sheet of FIG. 8), i.e., in a plane including a longitudinal direction and a lateral direction.

The case 5 is formed of resin and has an approximately rectangular parallelepiped box shape corresponding to the piezoelectric element unit 40. The case 5 includes a principal wall portion 51 which is parallel to the principal surface of the piezoelectric element unit 40 and has an approximately rectangular shape, a first short side wall portion 52 provided at a short side portion located at one side in the longitudinal direction (i.e., the left side of FIG. 1) of the principal wall portion 51, a second short side wall portion 53 provided at a short side portion located at the other side in the longitudinal direction (i.e., the right side of FIG. 1) of the principal wall portion 51, and a long side wall portion 54 provided at a long side portion located at one side in the lateral direction (i.e., the lower side of FIG. 1) of the principal wall portion 51. That is, no wall portion is provided at a plane opposed to the principal wall portion 51 and a long side portion (corresponding to the long side surface of the piezoelectric element unit 40 on which the driver elements 8 are provided) of the case 5 located at the other side in the lateral direction (i.e., the upper side of FIG. 1) of the principal wall portion 51, so that the case 5 is open at the above-described one side in the stacking direction of the piezoelectric element unit 40 (in the normal direction of the principal wall portion 51) and at the above-described other side of the lateral direction.

The actuator body 4 is placed in the case 5 configured in the above-described manner. Specifically, the actuator body 4 is placed in the case 5 so that one of the principal surfaces of the piezoelectric element unit 40 is opposed to the principal wall portion 51 and one of the long side surfaces of the piezoelectric element unit 40 (at which the external electrode 45 is provided) is opposed to the long side wall portion 54. In this state, the driver elements 8 stick out from the case 5 at the above-described other side in the lateral direction. The support rubbers 61 are provided between the one of the short side surfaces of the piezoelectric element unit 40 and the first short side wall portion 52 of the case 5 and between the other one of the short side surfaces of the piezoelectric element unit 40 and the second short side wall portion 53 of the case 5, respectively. Because the support rubbers 61 are elastic, the piezoelectric element unit 40 can be supported without damping longitudinal vibration of the piezoelectric element unit 40 even though each of the short side surfaces of the piezoelectric element unit 40 corresponds to an antinode of longitudinal vibration. The support rubbers 61 abut on not only the actuator body 4 and the first and second short side wall portions 52 and 53 but also an inner surface of the principal wall portion 51. Moreover, the bias rubber 62 is provided between one of the long side surfaces of the piezoelectric element unit 40 and the long side wall portion 54 of the case 5. The bias rubber 62 abuts on not only the actuator body 4 and the long side wall portion 54 but also the inner surface of the principal wall portion 51.

Electrodes 51a (only the electrode abutting on the bias rubber 62 is shown) are provided on parts of the inner surface of the principal wall portion 51 on which the support rubbers 61 and the bias rubber 62 abut. The electrodes 51a are in conduction with terminal electrodes (not shown) provided on an outer surface of the principal wall portion 51, respectively.

Each of the support rubbers 61 is formed of conductive rubber obtained by mixing metal particles into silicone rubber and has an approximately rectangular parallelepiped shape. The support rubbers 61 elastically support the actuator body 4 with the actuator body 4 biased in the longitudinal direction thereof. The support rubbers 61 bring the external electrodes 46 and 47 of the piezoelectric element unit 40 into conduction with electrodes which are provided at parts of the inner surface of the principal wall portion 51 corresponding to locations of the support rubbers 61 and are conductive with the terminal electrodes, respectively.

The bias rubber 62 is also formed of conductive rubber obtained by mixing metal particles into silicone rubber and has an approximately rectangular parallelepiped shape in the same manner as the support rubbers 61. The bias rubber 62 biases the actuator body 4 in the lateral direction thereof (i.e., the lateral direction corresponds to a bias direction). The bias rubber 62 also brings the external electrode 45 of the piezoelectric element unit 40 into conduction with the electrode 51a on the inner surface of the principal wall portion 51.

Instead of the support rubbers 61 and the bias rubber 62, elastic members such as plate springs or the like may be employed.

That is, power can be supplied to the piezoelectric element unit 40 by supplying power to the terminal electrodes provided on the outer surface of the case 5.

As shown in FIG. 2, the ultrasonic actuator 2 configured in the above-described manner is provided so that the driver elements 8 abut on the back surface of the stage 11 and the case 5 is fixed on the base (not shown). Specifically, the ultrasonic actuator 2 is placed so that the lateral direction of the piezoelectric element unit 40 is orthogonal to the back surface of the stage 11 and the longitudinal direction of the piezoelectric element unit 40 is in parallel to the back surface of the stage 11 and to the guides 12. In other words, the ultrasonic actuator 2 is arranged so that the direction of bending vibration of the piezoelectric element unit 40 is orthogonal to the back surface of the stage 11 and the direction of longitudinal vibration of the piezoelectric element unit 40 is in parallel to the guides 12.

In this state, the bias rubber 62 is compressed and deformed and the driver elements 8 are biased against the stage 11 by elastic force of the bias rubber 62. Bias force of the ultrasonic actuator 2 to the stage 11 is determined by the elastic force of the bias rubber 62.

The control unit receives an external operation command, and then, applies alternating voltages having a frequency corresponding to the operation command to the external electrodes 46 and 47, respectively, with a phase difference corresponding to the operation command.

As described above, the control unit allows the actuator body 4 i.e., the piezoelectric element unit 40 to generate longitudinal vibration and bending vibration in a cooperated manner to cause the driver elements 8 to make an orbit motion in the manner shown in FIGS. 8(a)-8(d), thereby moving the stage 11. Specifically, to prevent abnormal heat generation in the piezoelectric element unit 40, alternating voltages having a slightly higher frequency than a common resonance frequency for both longitudinal vibration and bending vibration of the piezoelectric element unit 40 are applied to the external electrodes 46 and 47. In this case, the alternating voltages applied to the external electrodes 46 and 47 have phases shifted from one another by 90°.

When the piezoelectric element unit 40 generates composite vibration of longitudinal vibration and bending vibration, each of the driver elements 8 makes an approximately elliptical motion in a plane including the longitudinal direction and the lateral direction of the piezoelectric element unit 40. Thus, the driver elements 8 give driving force to the stage 11 through friction force along the longitudinal direction of the piezoelectric element unit 40 while periodically repeating abutting on and separation from the stage 11, so that the stage 11 is moved along the guides 12. The longitudinal direction (coinciding with the direction in which the guides 12 extend) of the piezoelectric element unit 40 corresponds to a driving direction in which the driver elements 8 output driving force.

The driving of the stage 11 by the ultrasonic actuator 2 will be described in greater detail with reference to FIGS. 9(a)-9(c). When the piezoelectric element unit 40 expands along the longitudinal direction (vibration direction of longitudinal direction), as shown in FIG. 9(b), one of the driver elements 8 (for example, shown on the left side of FIGS. 9(a)-9(c)) is displaced in a region closer to the stage 11 in the lateral direction (vibration direction of bending direction). Thus, friction force with the stage 11 is increased, so that the stage 11 is moved by the friction force to the side (the left side of FIGS. 9(a)-9(c)) to which the one of the driver elements 8 is displaced along the longitudinal direction. In this case, the other one of the driver elements 8 (shown on the right side of FIGS. 9(a)-9(c)) is displaced in the opposite direction to the direction in which the one of the driver elements 8 is displaced along the longitudinal direction. However, because the other one of the driver elements 8 is displaced in a region less close to the stage 11 in the lateral direction (where the one of the driver elements 8 moves away from the stage 11), the other one of the driver elements 8 moves away from the stage 11 and friction force does not act. Thus, the other one of the driver elements 8 hardly affects the movement of the stage 11.

When the piezoelectric element unit 40 contracts along the longitudinal direction, as shown in FIG. 9(c), the other one of the driver elements 8 (shown on the right side of FIGS. 9(a)-9(c)) is displaced a region closer to the stage 11 in the lateral direction. Thus, friction force with the stage 11 is increased, so that the stage 11 is moved by the friction force to the side (the left side of FIGS. 9(a)-9(c)) to which the other one of the driver elements 8 is displaced along the longitudinal direction. This moving direction is the same direction as the moving direction of the stage 11 by the one of the driver elements 8 when the piezoelectric element unit 40 expands, which has been described above. In this case, the one of the driver elements 8 (shown on the left side of FIGS. 9(a)-9(c)) is displaced in the opposite direction to the direction in which the other one of the driver elements 8 is displaced along the longitudinal direction. However, because the one of the driver elements 8 is displaced in a region less close to the stage 11 in the lateral direction, the one of the driver elements 8 moves away from the stage 11 and friction force does not act. Thus, the one of the drive elements 8 hardly affects the movement of the stage 11.

Figure 9:
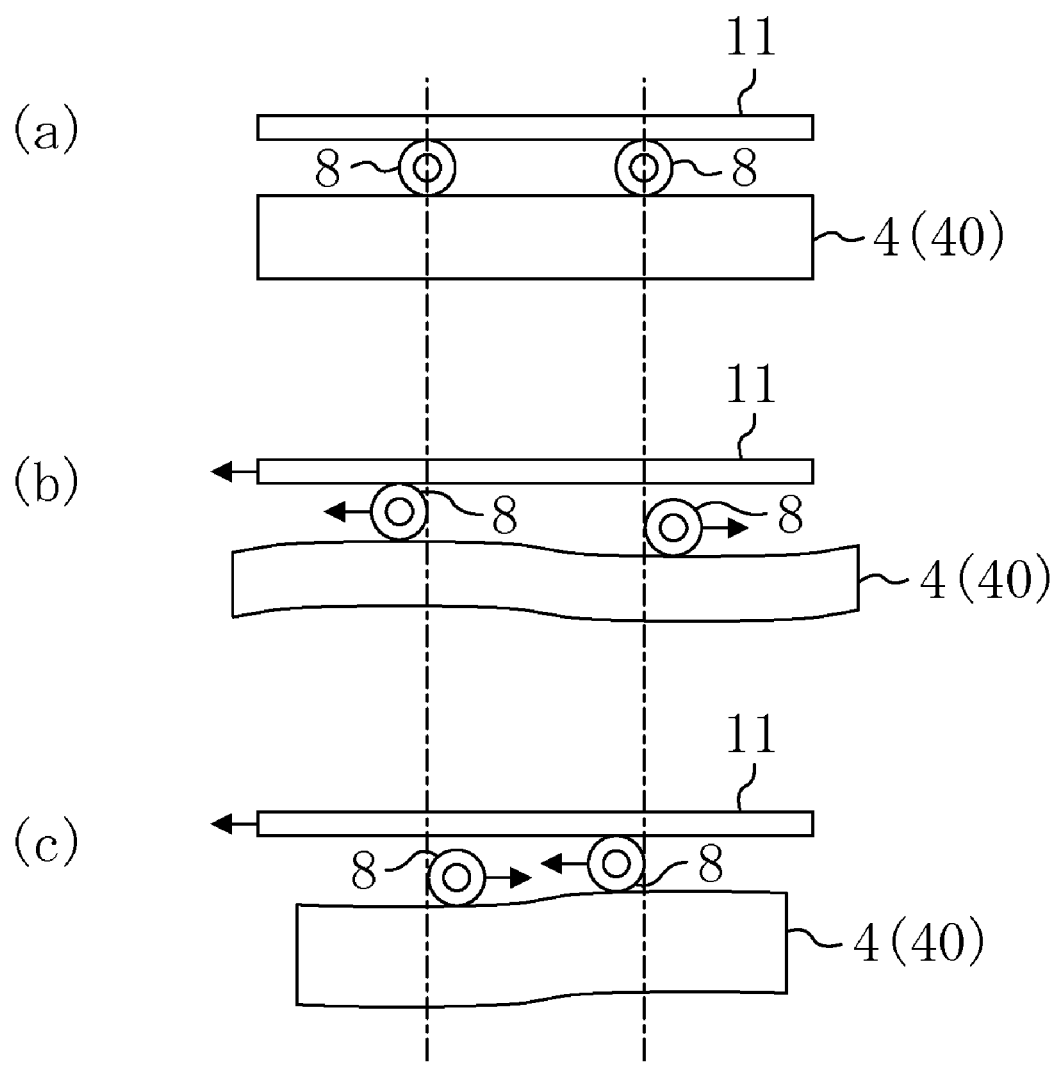
FIGS. 9(a)-9(c) are conceptual diagrams describing how a stage is driven by an ultrasonic actuator.

In FIG. 9, the driver element 8 which does not affect the movement of the stage 11 is separated from the stage 11, but it does not have to be separated. That is, the driver element 8 may be abutting on the stage 11 by friction force which is small enough not to move the stage 11.

In this manner, the one of the driver elements 8 and the other one of the driver elements 8 alternately move the stage 11 in a predetermined direction with phases shifted from one another by 180°. By applying alternating voltages having phases shifted from one another by −90° are applied to the external electrodes 46 and 47, respectively, the direction of driving force output by the driver elements 8 can be reversed, so that the stage 11 can be moved in the other direction.

The amount of movement, moving speed and acceleration rate of the moving speed of the stage 11 can be adjusted by adjusting at least one of the voltage values, frequency and supply time of alternating voltages to be supplied to the external electrodes 46 and 47, by changing a phase difference for each of alternating voltages to be applied to the external electrodes 46 and 47, or like method.

As described above, the ultrasonic actuator 2 drives the stage 11 while causing each of the driver elements 8 to make an orbit motion in a plane including the vibration direction (longitudinal direction) of longitudinal vibration and the vibration direction (lateral direction) of bending vibration and thereby repeating increase and reduction in friction force between each of the driver elements 8 and the stage 11.

The larger the outer circumference of each of the driver elements 8 is, the larger the orbit motion of each of the driver elements 8, specifically, the orbit motion of each abutting portions of the driver elements 8 on the stage 11 is larger. This is because the driver elements 8 attached to the mounting surface 40a by the adhesive bond 82 also generates leaning vibration, i.e., leaning motion in the right-left direction (longitudinal direction of the actuator body 4 which is the driving direction) with an abutting portion (hereinafter referred to as an "attached area") on the mounting surface 40*a* being centered. Due to this leaning vibration, the degree of vibration of an abutting portion (hereinafter referred to as an "abutting area") of each of the driver elements 8 on the stage 11 along the longitudinal direction of the actuator body 4 is larger than that of the attached area of each of the driver elements 8 (see FIGS. 8(*a*)-8(*d*)). That is, at the abutting area of each of the driver elements 8, the displacement along the longitudinal direction of the actuator body 4 is larger than that of the attached area of each of the driver elements 8 due to the leaning vibration of the driver elements 8, or in other words, the displacement is amplified, and thus, large driving force can be applied to the stage 11. The above-described leaning vibration is not limited to leaning vibration caused in the above-described abutting state of the driver elements 8 and the mounting surface 40*a*. The above-described abutting state is one preferable example. Another preferable example is a state where a part of each of the driver elements 8 having a certain area is solidly fixed to the mounting surface 40*a*. In such an abutting state, there might be cases where bending vibration of the driver element 8 itself is dominant (has a lower frequency) over vibration caused with the attached area of each of the driver elements 8 being centered. Even in such a case, the abutting area of each of the driver elements 8 swings along the longitudinal direction of the actuator body 4, and thus, at the abutting area of the driver element 8, the displacement is amplified to be larger than the displacement at the attached area. In the following section, an overall vibration state of the abutting area of each of the driver elements 8, which includes bending vibration and in which the abutting area swings along the longitudinal direction relatively to the attached area, will be referred to as leaning vibration, and the description will be continued.

It is also presumed that, with an increased outer circumference of each of the driver elements 8, a distance between the attached area and the abutting area of the driver element 8 is increased, and thus amplitude of leaning vibration is increased, so that large driving force can be applied to the stage 11. However, even with an increased outer circumference of each of the driver elements 8, large driving force cannot always be output.

That is, with an increased outer circumference of each of the driver elements 8, the weight of the driver element 8 is increased, and thus, the resonance frequency of leaning vibration is reduced. When the resonance frequency of leaning vibration is low relatively to the resonance frequency of longitudinal vibration of the piezoelectric element unit 40, which is one of vibrations of piezoelectric element unit 40 corresponding to the driving direction, a phase difference between leaning vibration and longitudinal vibration of the actuator body 4 is caused. As a result, timing of vibration displacement of the attached area of each of the driver elements 8 due to longitudinal vibration of the actuator body 4 does not match timing of vibration displacement of the abutting area of the driver element 8 due to leaning vibration of the driver element 8, so that displacement of the attached area of the driver element 8 cannot be transmitted to the abutting area as the displacement is amplified. For example, when the phase of leaning vibration is different from the phase of longitudinal vibration by 180°, the direction in which the attached area of the driver element 8 swings is opposite to the direction in which the abutting area of the driver element 8 swings. In such a case, no matter how much power is generated in the actuator body 4, leaning vibration is generated in the direction in which the generated power is canceled out, thus resulting in reduction in drive efficiency.

Therefore, according to this embodiment, the resonance frequency of leaning vibration is adjusted by forming a through hole 80 in each of the driver elements 8 so that the driver element 8 has a cylindrical shape and thus the weight of the driver element 8 is reduced. Thus, even when the outer circumference of each of the driver elements 8 is increased in order to increase the amplitude of leaning vibration of the driver element 8, increase in the weight of the driver element 8 can be prevented, and also reduction in the resonance frequency of leaning vibration can be prevented. As a result, while the amplitude of leaning vibration of the driver element 8 can be increased by increasing the outer circumference of the driver element 8, the phase of leaning vibration of the driver element 8 can be caused to be close to the phase of longitudinal vibration of the piezoelectric element unit 40. Thus, while the amplitude of leaning vibration of the driver element 8 is increased, the timing of vibration displacement of the abutting area of the driver element 8 can be matched to timing of vibration displacement of the actuator body 4. Accordingly, the displacement of the abutting area of the driver element 8 can be amplified in the same direction as the direction of the displacement of the attached area of the driver element 8 so as to be larger than the displacement of the attached area, so that large driving force can be applied to the stage 11. It is the most preferable that the phase of leaning vibration of the driver element 8 is substantially matched to the phase of longitudinal vibration of the piezoelectric element unit 40 because the largest driving force can be applied.

Therefore, according to Embodiment 1, the phase of leaning vibration of each of the driver elements 8 can be adjusted to be close to the phase of vibration (longitudinal vibration in this embodiment) in the driving direction of the actuator body 4 by providing the through hole 80 in the driver element 8, so that leaning vibration of the driver element 8 can be effectively utilized to amplify displacement of the attached area of the driver element 8 in the driving direction, i.e., displacement of the attached area in the driving direction of the actuator body 4. Thus, the abutting area of the driver element 8 can be displaced in the driving direction. That is, driving force of the attached area of the driver element 8 can be output as larger driving force from the abutting area of the driver element 8. As a result, the drive efficiency of the ultrasonic actuator 2 can be improved.

This is particularly effective when the outer circumference of the driver element 8 is increased in order to increase the amplitude of leaning vibration. That is, with the through hole 80 provided in the driver element 8, even when the outer circumference of the driver element 8 is increased, the resonance frequency of leaning vibration of the driver element 8 can be adjusted, and the phase of leaning vibration of the driver element 8 can be matched to the phase of longitudinal vibration of the actuator body 4. Also, with the increased outer circumference of the driver element 8, the amplitude of leaning vibration of the driver element 8 is increased, so that the displacement of the attached area of the driver element 8 in the driving direction can be further amplified and the abutting area of the driver element 8 can be displaced in the driving direction. As a result, the driving efficiency of the ultrasonic actuator 2 can be further improved.

Figure 10:
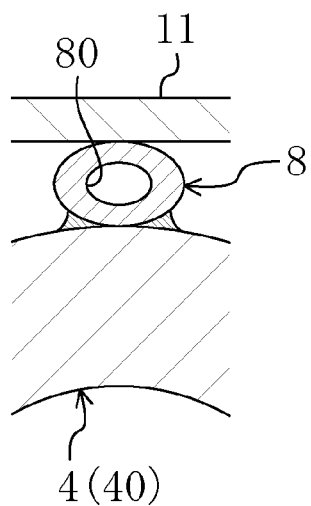
FIG. 10 is a schematic cross-sectional view showing how a driver element is deformed.

Moreover, the through hole 80 is formed in the driver element 8 so that the driver element 8 has a hollow shape, and thus, the driver element 8 is easily deformed. As a result, when the driver element 8 is pressed to the stage 11, as shown in FIG. 10, the driver element 8 is deformed in a pressing direction depending on the rigidity thereof. Thus, an area of the abutting portion of the driver element 8 with the stage 11 is increased, specifically along the longitudinal direction of the actuator body 4, which is the driving direction, so that the displacement of the driver element 8 can be reliably transmitted to the stage 11 and thus the drive efficiency of the ultrasonic actuator 2 can be further improved.

Furthermore, when the driver element 8 is deformed and an abutting area with the stage 11 is increased, a load per unit area of the driver element 8 and the stage 11 can be reduced, so that abrasion of the driver element 8 and the stage 11 can be reduced.

In recent years, with reduction in the size of electric devices, it is becoming desirable to reduce the size of the ultrasonic actuator 2. However, when the size of the ultrasonic actuator 2 is reduced, the efficiency might be reduced. That is, the shape of the driver elements 8 is expanded and becomes large relatively to the actuator body 4, and thus, as described above, damping of bending vibration of the actuator body 4 is caused in the configuration in which the driver elements 8 are provided in parts of the actuator body 4 corresponding to antinodes of bending vibration. As a result, the efficiency might be reduced.

In contrast, according to this embodiment, each of the driver elements 8 is formed into a circular column shape (cylindrical shape), so that a contact area of each of the driver elements 8 with the mounting surface 40a can be reduced, and damping of bending vibration of the actuator body 4 can be prevented although the driver elements 8 are provided on the long side surface which ripples due to bending vibration of the actuator body 4. In addition, the driver elements 8 are placed on and attached to the mounting surface 40a so that an axis of the circular column of each of the driver elements 8 extends in an orthogonal direction to each of the vibration directions of bending vibration and longitudinal vibration of the actuator body 4. Thus, damping of bending vibration of the actuator body 4 can be further prevented.

Embodiment 2

Next, an ultrasonic actuator 202 according to Embodiment 2 of the present invention will be described.

The ultrasonic actuator 202 of Embodiment 2 is different from the ultrasonic actuator of Embodiment 1 in that a through hole 280 in each of driver elements 208 includes a vibration absorbing member. Each member also shown in Embodiment 1 is identified by the same reference numeral, the description thereof will be omitted, and the configuration of each of different parts will be mainly described.

Figure 11:
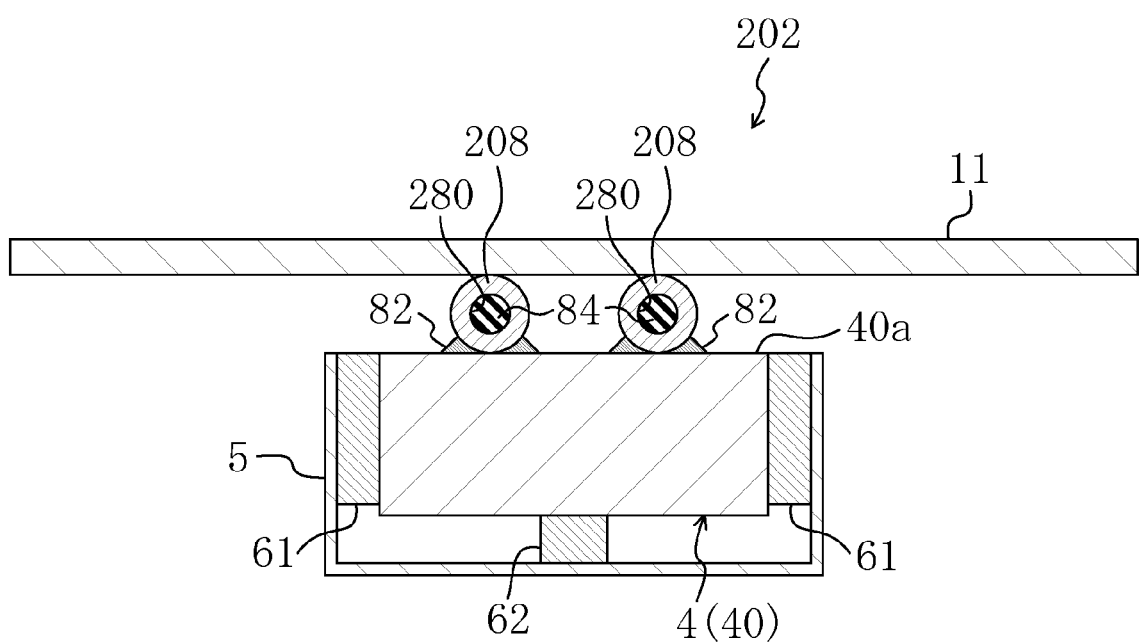
FIG. 11 is a cross-sectional view of an ultrasonic actuator according to Embodiment 2.

Specifically, as shown in FIG. 11, each of the driver elements 208 of the ultrasonic actuator 202 is configured so that a vibration absorbing member 84 is placed in the through hole 280. The through hole 280 forms a reduced-material portion.

As a material of the vibration absorbing member 84, a resin, a rubber material (for example, silicone rubber) or the like, which has a low elastic coefficient than that of the driver elements 8 and has excellent vibration absorption properties can be used.

As described above, each driver element having a hollow formed therein is deformed when being pressed to the stage 11. In addition, this deformation is repeated in synchronization with an orbit motion of the driver element. Therefore, there might be cases where the driver element independently resonates and makes deformation vibration at a different frequency from the resonance frequencies of bending vibration and longitudinal vibration of the actuator body 4. The resonance frequency of deformation vibration of the driver element varies according to the shape, specific gravity and elastic coefficient of the driver element, and in an extreme case, it changes an abutting state between the driver element and the stage 11 to cause reduction in efficiency of the ultrasonic actuator 202. Moreover, there might be cases where the resonance of deformation vibration of the driver element is generated as noise to cause reduction in low-noise properties of the ultrasonic actuator 202.

In contrast, according to this embodiment, the through hole 280 of each of the driver elements 208 includes a vibration absorbing member 84. Thus, deformation vibration of the driver elements 208 can be absorbed by the vibration absorbing members 84, so that reduction in efficiency of the ultrasonic actuator 202 can be prevented, and also the generation of noise can be prevented.

The vibration absorbing member 84 has a lower elastic coefficient than that of the driver elements 208, and therefore, deformation of the driver elements 208 is not prevented.

Embodiment 3

Next, an ultrasonic actuator 302 according to Embodiment 3 of the present invention will be described.

The ultrasonic actuator 302 of Embodiment 3 is different from the ultrasonic actuators of Embodiments 1 and 2 respectively including the circular column shaped driver elements 8 and 208 in that each of driver elements 308 has a spherical shape. Each member also shown in Embodiment 1 is identified by the same reference numeral, the description thereof will be omitted, and the configuration of each of different parts will be mainly described.

Figure 12:
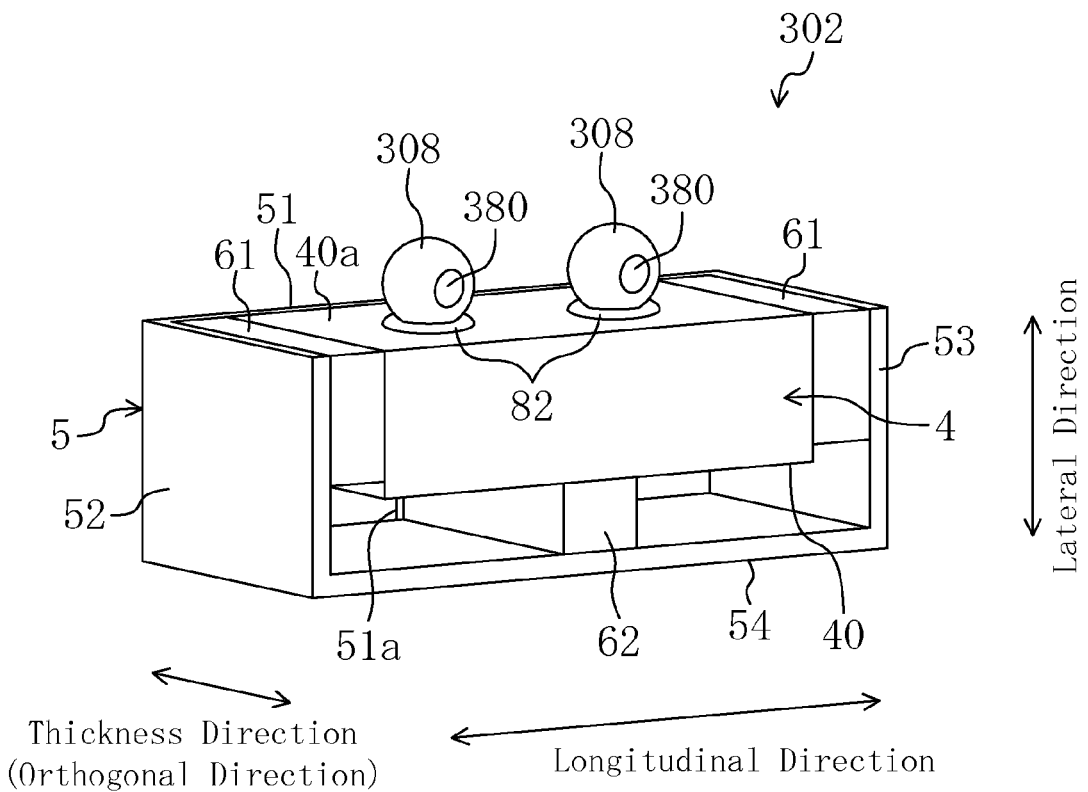
FIG. 12 is a perspective view of an ultrasonic actuator according to Embodiment 3.

Specifically, as shown in FIG. 12, each of the driver elements 308 of the ultrasonic actuator 302 is a spherical shaped member and has a through hole 380 formed therein. The through hole 380 forms a reduced-material portion.

Each of the driver elements 308 is attached to the mounting surface 40a so that an axis of each of the through hole 380 extends in a thickness direction of the actuator body 4.

Each of the driver elements 308 is attached to the mounting surface 40a by an adhesive bond 82 so as to be in point contact with the mounting surface 40a. The term "point contact" is used herein to describe not only a state where the driver elements 308 are in contact with the mounting surface 40a in a strict sense, but also a state where the driver elements 308 are substantially in point contact with the mounting surface 40a with the adhesive bond 82 interposed between the driver elements 308 and the mounting surface 40a.

Therefore, according to Embodiment 3, the phase of leaning vibration of each of the driver elements 308 can be adjusted to be close to the phase of vibration of the actuator body 4 in the driving direction by providing the through hole 380 in the driver element 308, so that leaning vibration of the driver element 308 can be effectively utilized to output driving force generated in the actuator body 4 as larger driving force from an abutting area of the driver element 308. As a result, the drive efficiency of the ultrasonic actuator 302 can be improved.

Furthermore, even when the outer circumference of the driver elements 308 is increased, the phase of leaning vibration can be adjusted so as to be close to the phase of vibration of the actuator body 4 in the driving direction by providing the through hole 380 in the driver element 308. Thus, driving force generated in the actuator body 4 can be amplified by leaning vibration, and the amplified driving force can be output from the abutting area of the driver element 308. With an increased outer circumference of the driver element 308, driving force generated in the actuator body 4 can be further amplified.

With each of the driver elements 308 formed to have a spherical shape, a contact area between the driver element 308 and the mounting surface 40a of the actuator body 4 can be reduced, so that damping of bending vibration of the actuator body 4 can be prevented. As a result, the efficiency of the ultrasonic actuator 302 can be improved. The term "spherical shape" is used herein to describe not only a spherical shape in a strict sense, but also a substantially spherical shape which allows each of the driver element 308 to be in a substantial point contact with the piezoelectric element unit 40.

Additionally, the same function and effects as those of Embodiment 1 can be achieved.

The through hole 380 of each of the driver elements 308 may include a vibration absorbing member as in Embodiment 2.

Figure 13:
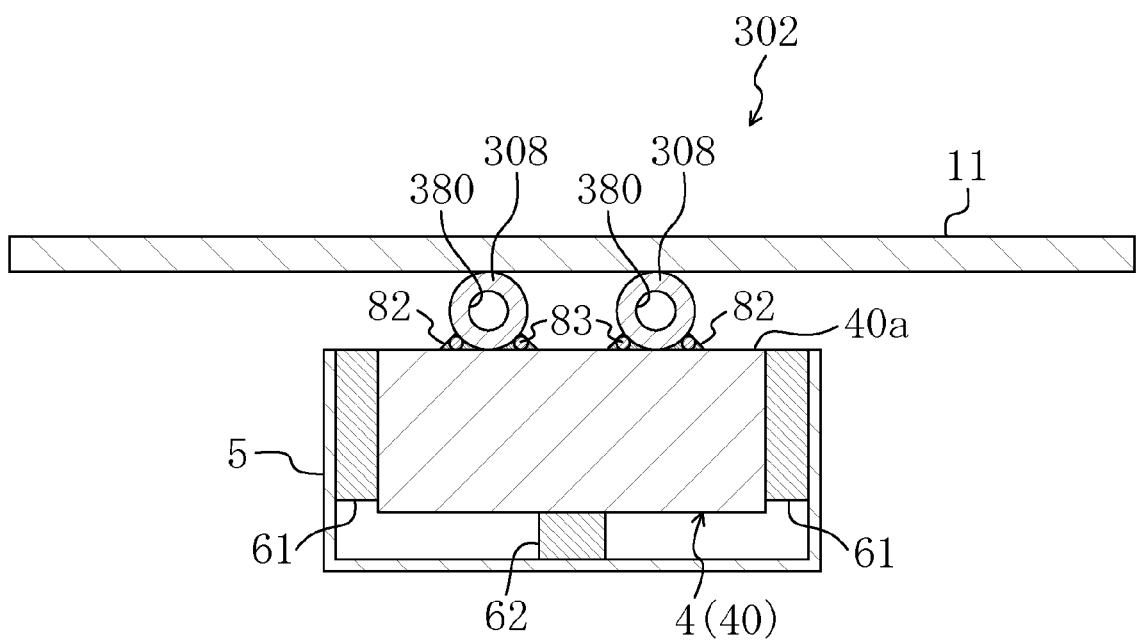
FIG. 13 is a cross-sectional view of an ultrasonic actuator according to a modified example of Embodiment 3.

As shown in FIG. 13, a circular body 83 may be provided around each of the driver elements 308. That is, the circular body 83 is placed around a contact point of each of the driver elements 308 with the mounting surface 40a. Specifically, each of the driver elements 308 is attached to the mounting surface 40a not only in a point contact manner, but also with the circular body 83 interposed therebetween. The circular body 83 is attached to each of the driver element 308 and the mounting surface 40a in line contact manner. Each of the driver elements 308 is attached to the circular body 83 by the adhesive bond 82, and the circular body 83 is attached to the mounting surface 40a by the adhesive bond 82. Each of the driver elements 308 may be configured so as not to be in point contact with the mounting surface 40a but to be only in line contact with the mounting surface 40a with the circular body 83 interposed therebetween. The term "line contact" is used herein to describe not only a state where the circular body 83 is in contact with the driver element 308 or the mounting surface 40a in a strict sense, but also a state where the circular body 83 is substantially in line contact with the driver element 308 or the mounting surface 40a with the adhesive bond 82 interposed between the circular body 83 and the driver element 308 or the mounting surface 40a.

With the circular body 83 placed in the above-described manner, the number of contact points of each of the driver elements 308 with the circular body 83 and of the circular body 83 with the mounting surface 40a can be increased, so that contact strength of each of the driver elements 308 with the mounting surface 40a can be improved. The circular body 83 is preferably formed of a material which is softer than the driver elements 308 and harder than the adhesive bond 82, in terms of improving the contact strength without preventing vibration. Specifically, the circular body 83 may be formed of metal such as aluminum, iron or the like, or hard resin such as epoxy, phenol or the like.

Embodiment 4

Subsequently, an ultrasonic actuator 402 according to Embodiment 4 of the present invention will be described.

The ultrasonic actuator 402 of the Embodiment 4 is different from the ultrasonic actuator of Embodiment 1 in that each of driver elements 408 has a different shape from the shape of each driver element of Embodiment 1. Each member also shown in Embodiment 1 is identified by the same reference numeral, the description thereof will be omitted, and the configuration of each of different parts will be mainly described.

Figure 14:
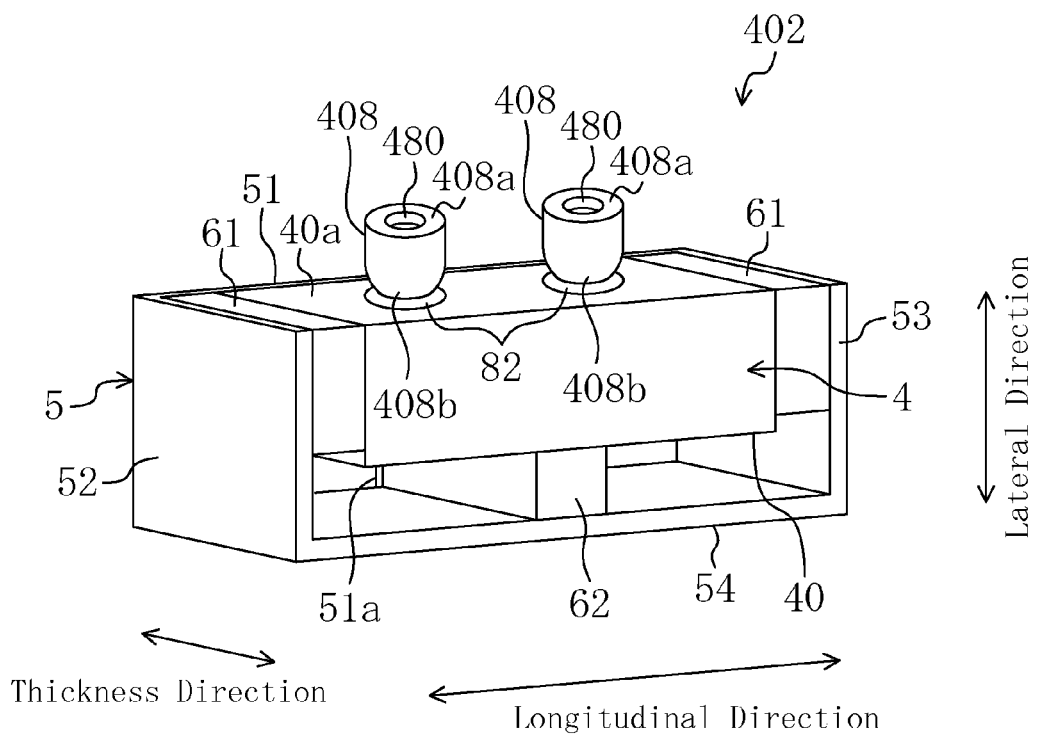
FIG. 14 is a perspective view of an ultrasonic actuator according to Embodiment 4.

Specifically, as shown in FIG. 14, each of the driver elements 408 of the ultrasonic actuator 402 has a combined shape of a circular column and a hemisphere. That is, each of the driver elements 408 includes a planar portion 408a formed on one end thereof and a spherical portion 408b on the other end thereof.

In the planar portion 408a, a recess portion 480 is formed so as to extend toward the other end at the center of the planar portion 408a. That is, the recess portion 480 forms a reduced-material portion, and the planar portion 408a forms an opening end part of the recess portion 480.

Each of the driver elements 408 configured in the above-described manner is attached to a mounting surface 40a of the actuator body 4 so that the spherical portion 408b is in point contact with the mounting surface 40a by the adhesive bond 82. In this case, the planar portion 408a of each of the driver elements 408 is in parallel to the mounting surface 40a, and the recess portion 480 is open at the opposite side to the mounting surface 40a.

Figure 15:
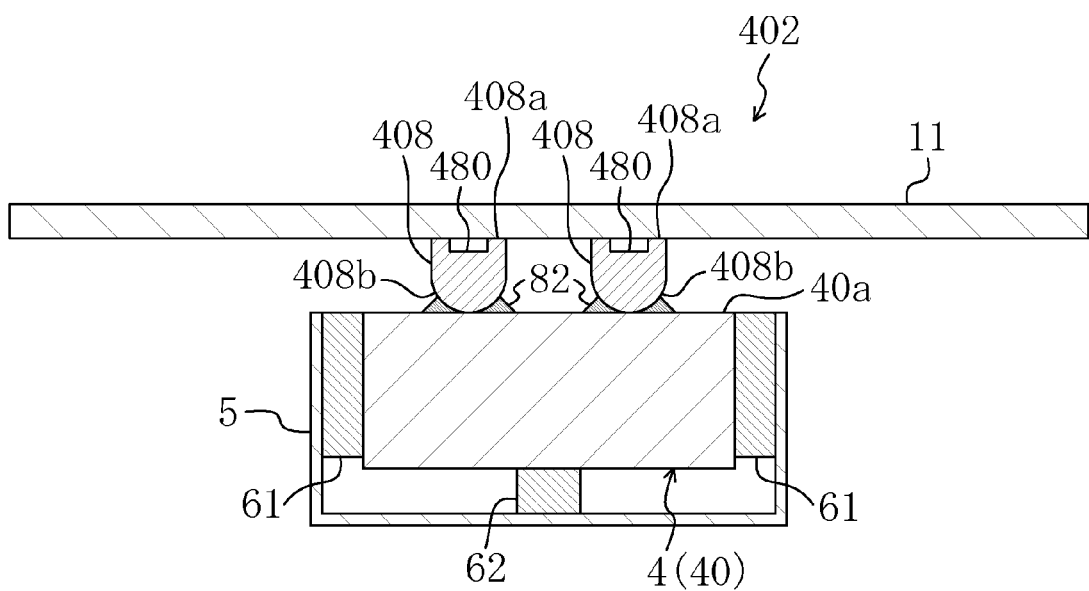
FIG. 15 is a cross-sectional view of the ultrasonic actuator according to Embodiment 4.

As shown in FIG. 15, the ultrasonic actuator 402 including the driver elements 408 is allocated so that the planar portion 408a of each of the driver elements 408 abuts on the stage 11. That is, each of the driver elements 408 is attached to the mounting surface 40a of the actuator body 4 via the spherical portion 408b while the planar portion 408a abuts on the stage 11.

With the ultrasonic actuator 402 described above, wear debris of the driver elements 408 and the stage 11 can be collected in the recess portion 480 of each of the driver elements 408.

That is, in the ultrasonic actuator 402 in which the stage 11 is driven through friction force between each of the driver elements 408 and the stage 11, the driver elements 408 and the stage 11 become worn. When wear debris generated due to the wear scatters, the performance of the actuator might not be ensured or the performance of an apparatus including the actuator might be adversely affected.

Therefore, according to this embodiment, the recess portion 480 is formed in each of the driver elements 408, and each of the driver elements 408 is placed so that the recess portion 480 faces toward the stage 11. Thus, wear debris of the driver elements 408 and the stage 11 can be deposited in the recess portion 480, so that the amount of wear debris scattering circumferentially can be greatly reduced.

According to Embodiment 4, the phase of leaning vibration of each of the driver elements 408 can be adjusted to be close to the phase of vibration of the actuator body 4 in the driving direction by providing the recess portion 480 in each of the driver elements 408, so that leaning vibration of the driver element 408 can be effectively utilized to output driving force generated in the actuator body 4 as larger driving force from an abutting area of the driver element 408. As a result, the drive efficiency of the ultrasonic actuator 402 can be improved.

Furthermore, even when the outer circumference of the driver elements 408 is increased, the phase of leaning vibration can be adjusted so as to be close to the phase of vibration of the actuator body 4 in the driving direction by providing the recess portion 480 in the driver element 408. Thus, driving force generated in the actuator body 4 can be amplified by leaning vibration, and the amplified driving force can be output from the abutting area of the driver element 408. With an increased outer circumference of the driver element 408, driving force generated in the actuator body 4 can be further amplified.

In addition, wear debris of the driver elements 408 and the stage 11 can be collected in the recess portion 480 by placing each of the driver elements 408 so that the recess portion 480 faces toward the stage 11. Thus, reduction in performance of the ultrasonic actuator 402 or of an apparatus including the ultrasonic actuator 402 due to scattering of wear debris can be prevented.

Specifically, with the recess portion 480 formed in the center of the ring-shaped planar portion 408a, in whichever direction the stage 11 is driven along the longitudinal direction of the actuator body 4, which is the driving direction, wear debris can be effectively collected.

Furthermore, with the abutting portion of each of the driver elements 408 and the stage 11 formed of the planar portion 408a, when the ultrasonic actuator 402 is placed with the actuator body 4 biased to the stage 11 side by the bias rubber 62, the actuator body 4 can be caused to rotate so that the planar portion 408a of each of the driver elements 408 closely fits the stage 11. Thus, the attitude of the actuator body 4 can be corrected to be a desired attitude.

That is, in the configuration in which the actuator body 4 is supported by the support rubbers 61 in the case 5, the attitude of the actuator body 4 can be flexibly changed by deformation of the support rubbers 61. In this configuration, the abutting portion of the driver element 408 is the planar portion 408a corresponding to an abutment part of the stage 11, i.e., a back surface of the stage 11. Thus, with the actuator body 4 biased against the stage 11, the attitude of the actuator body 4 can be corrected so that the planar portion 408a of the driver elements 408 closely fits the back surface of the stage 11. This effectively works particularly when the actuator body 4 is tilted from a desired attitude depending on the shape accuracy of the support rubbers 61 for supporting the actuator body 4, the bias rubber 62 for biasing the actuator body 4, or the case 5 for housing those members.

Embodiment 5

Subsequently, an ultrasonic actuator 502 according to Embodiment 5 of the present invention will be described.

The ultrasonic actuator 502 of Embodiment 5 includes driver elements 508 each having a circular column shape, but is difference from the ultrasonic actuator of Embodiment 1 in that each of the driver elements 508 is placed so as to have a different attitude. Each member also shown in Embodiment 1 is identified by the same reference numeral, the description thereof will be omitted, and the configuration of each of different parts will be mainly described.

Figure 16:
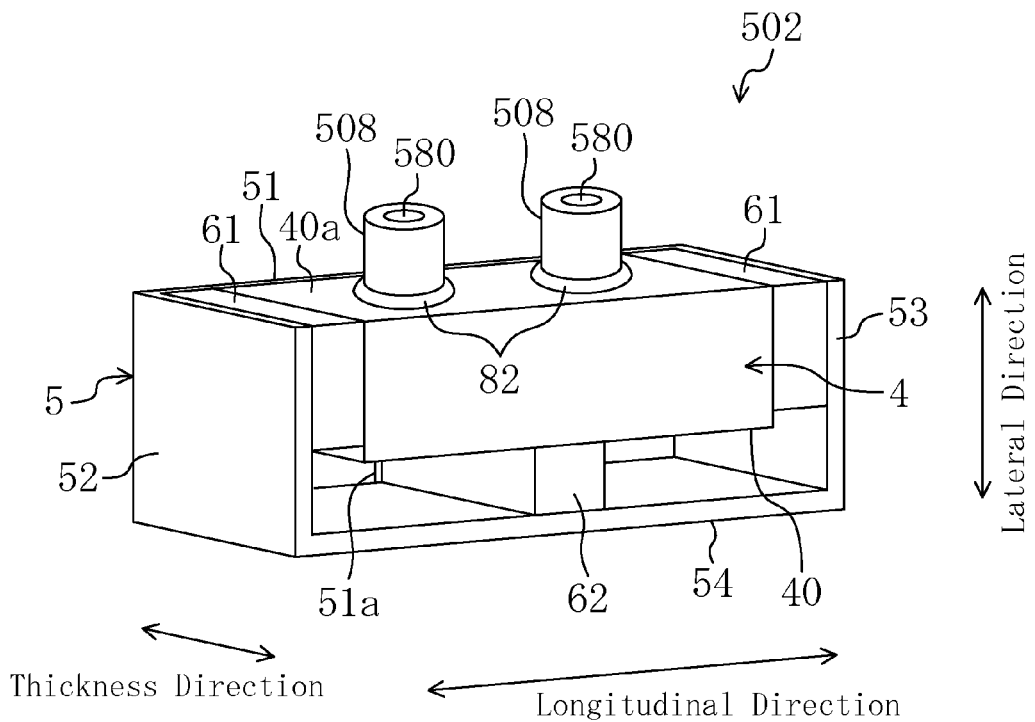
FIG. 16 is a perspective view of an ultrasonic actuator according to Embodiment 5.

Specifically, as shown in FIG. 16, each of the driver elements 508 of the ultrasonic actuator 502 is a circular column shaped member which has a concentric through hole 580 formed to extend along an axis direction, i.e., a cylindrical member. End faces of each of the driver elements 508 are formed flat. The through hole 580 forms a reduced-material portion and a recess portion, and a ring-shaped end face of each of the driver elements 508 forms an opening end part of the recess portion.

Each of the driver elements 508 is placed on the mounting surface 40a so that the axis direction of the driver element 508 is orthogonal to the mounting surface 40a. That is, the through hole 580 of each of the driver elements 508 is open at the opposite side to the mounting surface 40a. Each of the driver elements 508 is attached to the mounting surface 40a by the adhesive bond 82.

Figure 17:
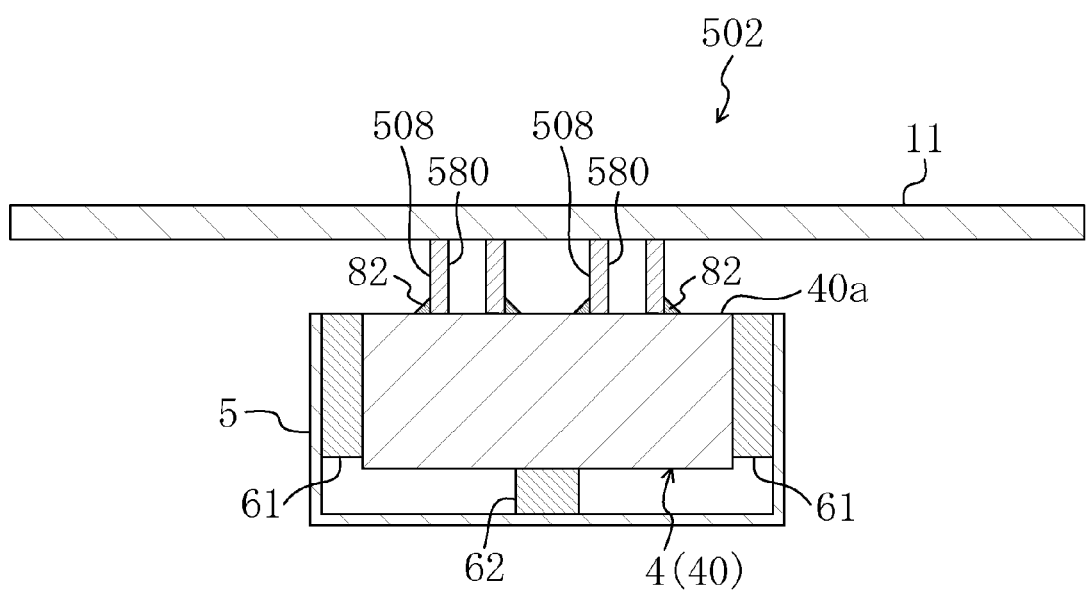
FIG. 17 is a cross-sectional view of the ultrasonic actuator according to Embodiment 5.

As shown in FIG. 17, the ultrasonic actuator 502 including the driver elements 508 is placed so that the ring-shaped end face of each of the driver elements 508 abuts on the stage 11.

With the ultrasonic actuator 502 configured in the above-described manner, wear debris of the driver elements 508 and the stage 11 can be collected in the through hole 580 of each of the driver elements 508.

That is, in the ultrasonic actuator 502 in which the stage 11 is driven through friction force between each of the driver elements 508 and the stage 11, the driver elements 508 and the stage 11 become worn. When wear debris generated due to the wear scatters, the performance of the ultrasonic actuator 502 might not be ensured or the performance of an apparatus including the ultrasonic actuator 502 might be adversely affected.

Therefore, according to this embodiment, the through hole 580 is formed in each of the driver elements 508, and each of the driver elements 508 is configured so that the opening end part of the through hole 580 abuts on the stage 11. Thus, wear debris of the driver elements 508 and the stage 11 can be deposited in the through hole 580, so that the amount of wear debris scattering circumferentially can be greatly reduced. Specifically, the opening end part, which is an abutting portion of each of the driver elements 508, is an end face of a circular cylinder and covers an whole circumference of the through hole 580. Thus, in whichever direction the stage 11 is driven along the longitudinal direction of the actuator body 4, wear debris can be effectively collected.

Therefore, according to Embodiment 5, the phase of leaning vibration of each of the driver elements 508 can be adjusted to be close to the phase of vibration of the actuator body 4 in the driving direction by providing the through hole 580 in the driver element 508, so that leaning vibration of the driver element 508 can be effectively utilized to output driving force generated in the actuator body 4 as larger driving force from the abutting area of the driver element 508. As a result, the drive efficiency of the ultrasonic actuator 502 can be improved.

Furthermore, even when the outer circumference of the driver elements 508 is increased, the phase of leaning vibration can be adjusted so as to be close to the phase of vibration of the actuator body 4 in the driving direction by providing the through hole 580 in each of the driver elements 508. Thus, driving force generated in the actuator body 4 can be amplified by leaning vibration, and the amplified driving force can be output from the abutting area of the driver element 508. With an increased outer circumference of the driver element 508, driving force generated in the actuator body 4 can be further amplified.

In addition, wear debris of the driver elements 508 and the stage 11 can be collected in the through hole 580 by placing each of the driver elements 508 so that the through hole 580 faces toward the stage 11. Thus, reduction in performance of the ultrasonic actuator 502 or of an apparatus including the ultrasonic actuator 502 due to scattering of wear debris can be prevented.

Since the opening end part of each of the driver elements 508 is an end face of a circular cylinder and is formed in one plane, as in Embodiment 4, when the ultrasonic actuator 502 is placed with the actuator body 4 biased against the stage 11 by the bias rubber 62, the actuator body 4 can be rotated so that the opening end part of each of the driver elements 508 closely fits the stage 11. Thus, the attitude of the actuator body 4 can be corrected to be a desired attitude.

Figure 18:
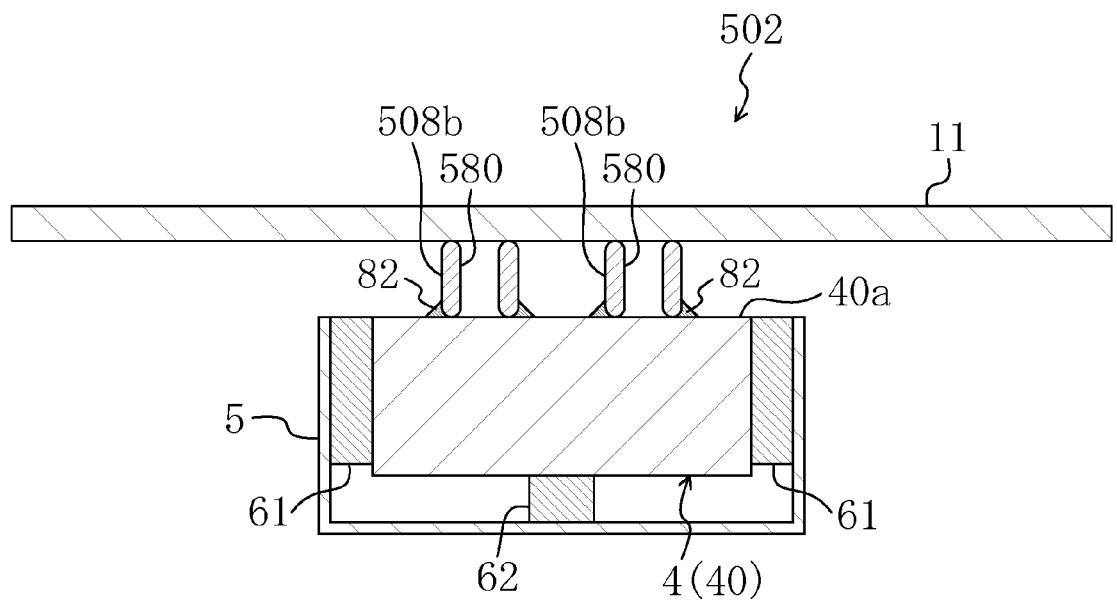
FIG. 18 is a cross-sectional view of an ultrasonic actuator according to a modified example of Embodiment 5.

As driver elements 508b shown in FIG. 18, each end face of each circular cylinder may be rounded. In that case, each of the driver elements 508b is attached to the mounting surface 40a so as to be in line contact with the mounting surface 40a. Thus, a contact area of the driver element 508b and the mounting surface 40a of the actuator body 4 can be reduced, and damping of bending vibration of the actuator body 4 can be prevented. As a result, the efficiency of the ultrasonic actuator 502 can be improved.

Moreover, with each end face of each of the driver elements 508b rounded, each of the driver elements 508b is in line contact with the stage 11 and a contact area is reduced, so that a certain suppress strength per unit area can be ensured. Thus, even when the suppress strength of the driver elements 508b to the stage 11 is small, the stage 11 can be driven. That is, the power consumption of the ultrasonic actuator 502 can be reduced.

Embodiment 6

Subsequently, an ultrasonic actuator 602 according to Embodiment 6 of the present invention will be described.

The ultrasonic actuator 602 of Embodiment 6 is different from the ultrasonic actuator of Embodiment 1 in that a notch portion is formed in each of driver elements 608. Each member also shown in Embodiment 1 is identified by the same reference numeral, the description thereof will be omitted, and the configuration of each of different parts will be mainly described.

Figure 19:
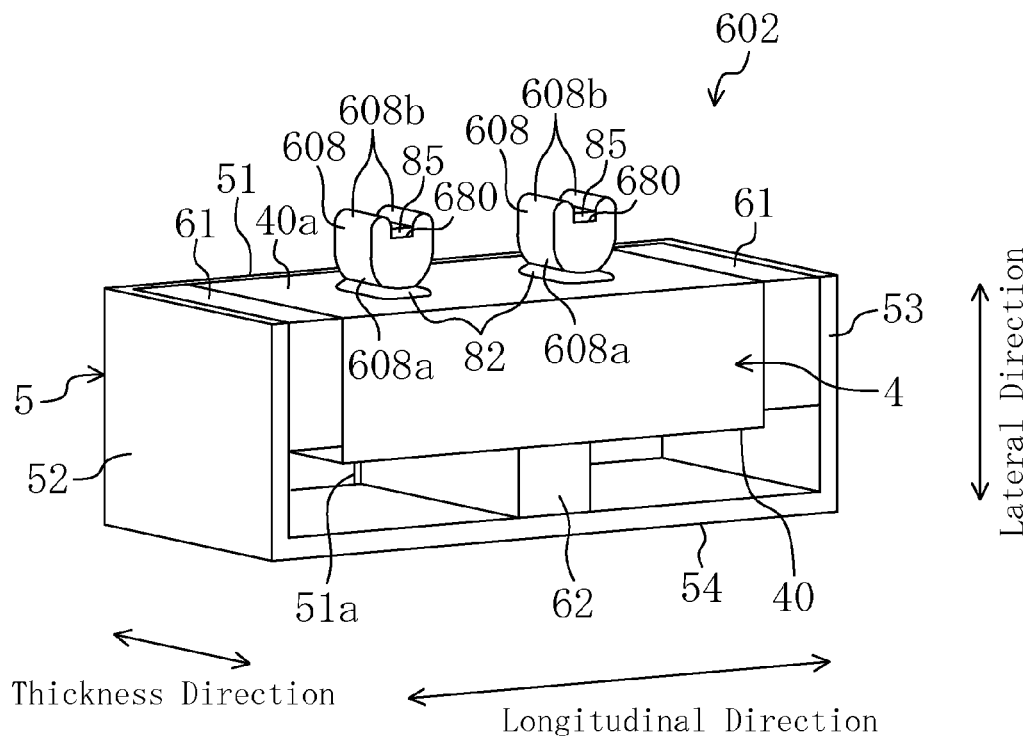
FIG. 19 is a perspective view of an ultrasonic actuator according to Embodiment 6.

Specifically, as shown in FIG. 19, each of the driver elements 608 of the ultrasonic actuator 602 is a column shaped member. Each of the driver elements 608 includes a circular column shaped portion 608a with a side surface formed to be a surface of a circular column, a notch portion 680 formed by notching the column shaped member along an axis direction thereof, abutting portions 608b formed to abut on the stage 11 and to be arranged so that the notch portion 680 is located therebetween.

The notch portion 680 and abutting portions 608b are formed on the opposite side to the circular column shaped portion 608a. That is, the notch portion 680 is formed on a part of each of the driver elements 608 located on the opposite side to the circular column shaped portion 608a, so that remaining portions at both sides of the notch portion 680 form the abutting portions 608b. An end part of each of the abutting portions 608b formed in the above-described manner is rounded. Moreover, an absorptive member 85 having an absorptive property is placed in the notch portion 680. The notch portion 680 form a reduced-material portion and a recess portion, and the abutting portions 608b form an opening end part of each of the driver elements 608.

As a material of the absorptive member 85, for example, viscous natural rubber, viscous synthetic rubber such as SBR (styrene-butadiene rubber), NBR (acrylonitrile-butadiene rubber) and the like can be used. Alternatively, the absorptive member 85 may be made of a resin/metal material with a synthetic resin adhesive applied thereto.

Each of the driver elements 608 configured in the above-described manner is placed on the mounting surface 40a so that an axis direction of the driver element 608 extends along the thickness direction of the actuator body 4. Each of the driver elements 608 is attached to the mounting surface 40a of the actuator body 4 so that the circular column shaped portion 608a is in line contact with the mounting surface 40a with the adhesive bond 82 interposed therebetween. Similarly, a longitudinal direction of the notch portion 680 extends along the thickness direction and, as a result, the two abutting portions 608b align along the longitudinal direction of the actuator body 4.

Figure 20:
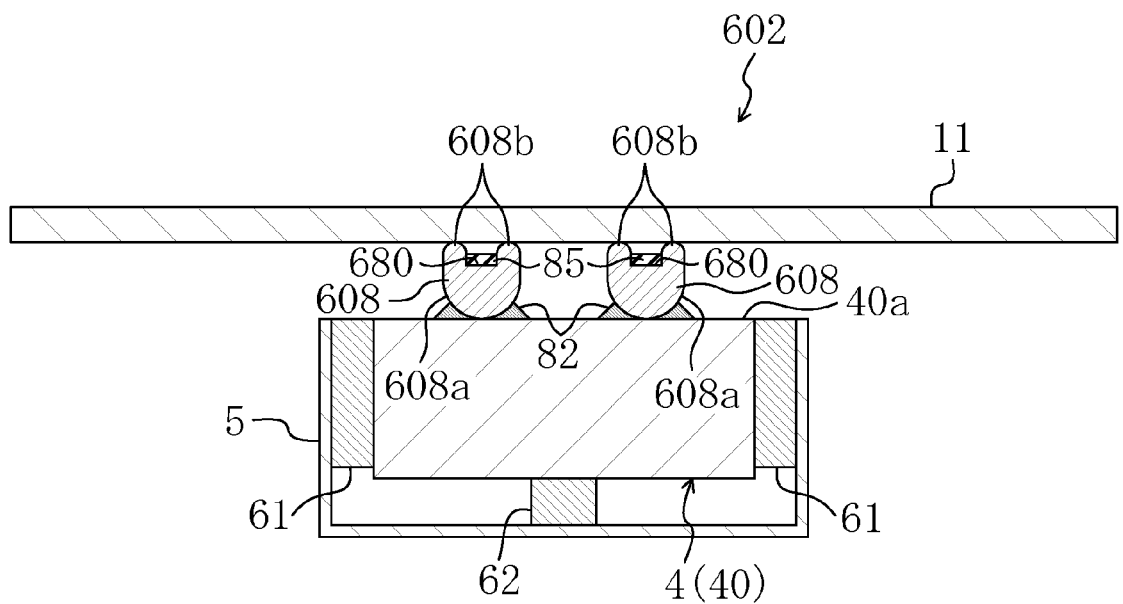
FIG. 20 is a cross-sectional view of the ultrasonic actuator according to Embodiment 6.

As shown in FIG. 20, the ultrasonic actuator 602 including the driver elements 608 is placed so that each of the abutting portions 608b of each of the driver elements 608 abut on the stage 11.

With the ultrasonic actuator 602 configured in the above-described manner, wear debris of the driver elements 608 and the stage 11 can be collected in the notch portion 680 of each of the driver elements 608.

Therefore, according to Embodiment 6, the phase of leaning vibration of each of the driver elements 608 can be adjusted to be close to the phase of vibration of the actuator body 4 in the driving direction by providing the notch portion 680 in the driver element 608, so that leaning vibration of the driver element 608 can be effectively utilized to output driving force generated in the actuator body 4 as larger driving force from the abutting area of the driver element 608. As a result, the drive efficiency of the ultrasonic actuator 602 can be improved.

Furthermore, even when the outer circumference of the driver elements 608 is increased, the phase of leaning vibration can be adjusted so as to be close to the phase of vibration of the actuator body 4 in the driving direction by providing the notch portion 680 in each of the driver elements 608. Thus, driving force generated in the actuator body 4 can be amplified by leaning vibration, and the amplified driving force can be output from the abutting area of the driver element 608. With an increased outer circumference of the driver element 608, driving force generated in the actuator body 4 can be further amplified.

In addition, wear debris of the driver elements 608 and the stage 11 can be collected in the notch portion 680 by placing each of the driver elements 608 so that the notch portion 680 faces toward the stage 11. Thus, reduction in performance of the ultrasonic actuator 602 or of an apparatus including the ultrasonic actuator 602 due to scattering of wear debris can be prevented.

Moreover, the abutting portions 608b are respectively provided at both sides of the notch portion 680 along the longitudinal direction of the actuator body 4 so that the notch portion 680 is located between the abutting portions 608b. Thus, when the stage 11 is driven in either direction along the longitudinal direction of the actuator body 4, wear debris of the abutting portions 608b and the stage 11 can be effectively collected.

Furthermore, the end parts of the abutting portions 608b of the driver elements 608 are located on the same plane. Thus, as in Embodiment 4, when the ultrasonic actuator 602 is placed with the actuator body 4 biased against the stage 11 by the bias rubber 62, the actuator body 4 can be rotated so that the end parts of the abutting portions 608b of the driver elements 608 closely fit the stage 11. Thus, the attitude of the actuator body 4 can be corrected to be a desired attitude.

Other Embodiments

According to the present invention, in connection with the above-described embodiments, an ultrasonic actuator may have the following configuration.

That is, in each of Embodiments 1-3, a through hole is formed in each of driver elements. However, the present invention is not limited thereto. Specifically, not a through hole but a hole with a bottom may be formed therein. As long as a configuration in which the material of each of the driver elements is partially reduced can be given, any shape can be employed. Moreover, the direction in which the axis of the through hole is not limited to the thickness direction of the actuator body 4, but may be any direction. However, to achieve deformation by pressing force to the stage 11 in a simple manner, the axis of the through hole is preferably in parallel to the mounting surface 40a.

The driver elements of the above-described embodiments have a spherical shape or a circular column shape. However, the shape of the driver elements is not limited thereto. Driver elements having any shape such as rectangular column shape, a trapezoidal shape or the like can be employed.

Furthermore, the number of the driver elements is not limited to the number indicated in the above-described embodiments, but may be any number of driver elements can be employed.

The ultrasonic actuator 2 is configured so as to cause the actuator body 4 to generate a first-order mode of longitudinal vibration along the longitudinal direction and a second-order mode of bending vibration in a cooperated manner, but the ultrasonic actuator 2 is not limited to such a configuration. The ultrasonic actuator 2 may have a configuration in which some other type of vibration or mode is induced. As long as a vibratory actuator is configured so that the actuator body 4 is vibrated to output driving force through friction force between each of the driver elements 8 and the stage 11, any configuration can be employed.

The configuration of the ultrasonic actuator 2 is not limited to the above-described configuration. For example, the ultrasonic actuator 2 may have, instead of the configuration in which power is supplied to the piezoelectric element unit 40 via the support rubbers 61 and the bias rubber 62, a configuration in which lead lines are connected to piezoelectric element unit 40 to supply power to the piezoelectric element unit. A configuration in which a node portion of vibration of each piezoelectric element unit 40 is supported by an anelastic member may be employed.

Figure 21:
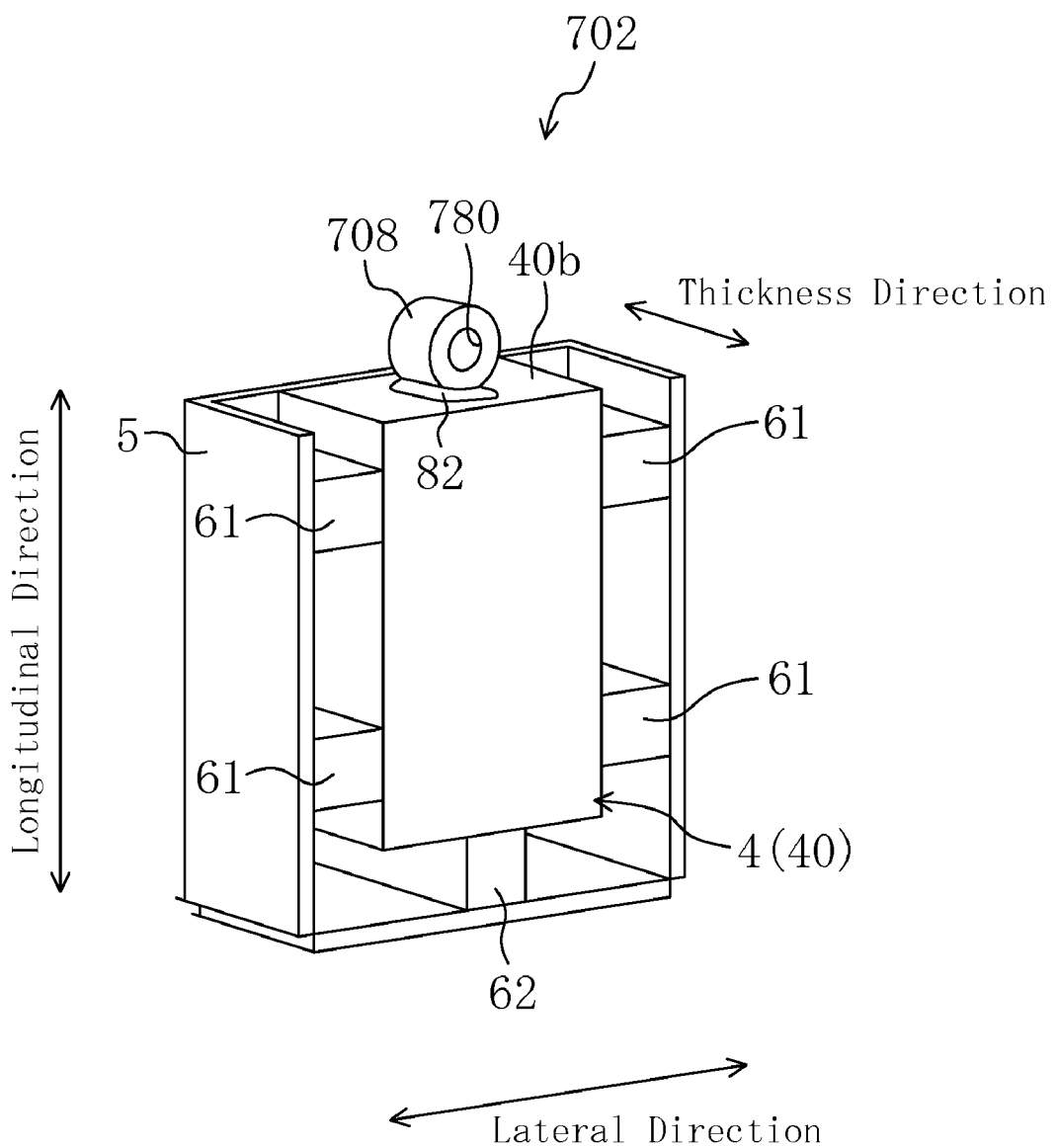
FIG. 21 is a perspective view of an ultrasonic actuator according to another embodiment.

Furthermore, as shown in FIG. 21, an ultrasonic actuator 702 in which a driver element 708 is provided on one of short side surfaces 40b (which corresponds to a mounting surface) of the piezoelectric element unit 40 may be employed. A through hole 780 as a reduced-material portion is formed in the driver element 708. Even in such a configuration, the piezoelectric element unit 40 generates composite vibration of a first-order mode of longitudinal vibration along the longitudinal direction and a second-order mode of bending vibration to cause the driver element 708 to make an orbit motion, so that the stage can be moved in a predetermined movable direction (a parallel direction to the lateral direction) through friction force with the stage.

Also, the actuator body 4 is formed of the piezoelectric element unit 40. However, the actuator body 4 may have a configuration in which a piezoelectric element is attached to a substrate of metal or the like or a configuration in which an oscillator is formed of metal or the like and a piezoelectric element is inserted therein. In such a configuration, an oscillator including a piezoelectric element forms an actuator body.

Figure 22:
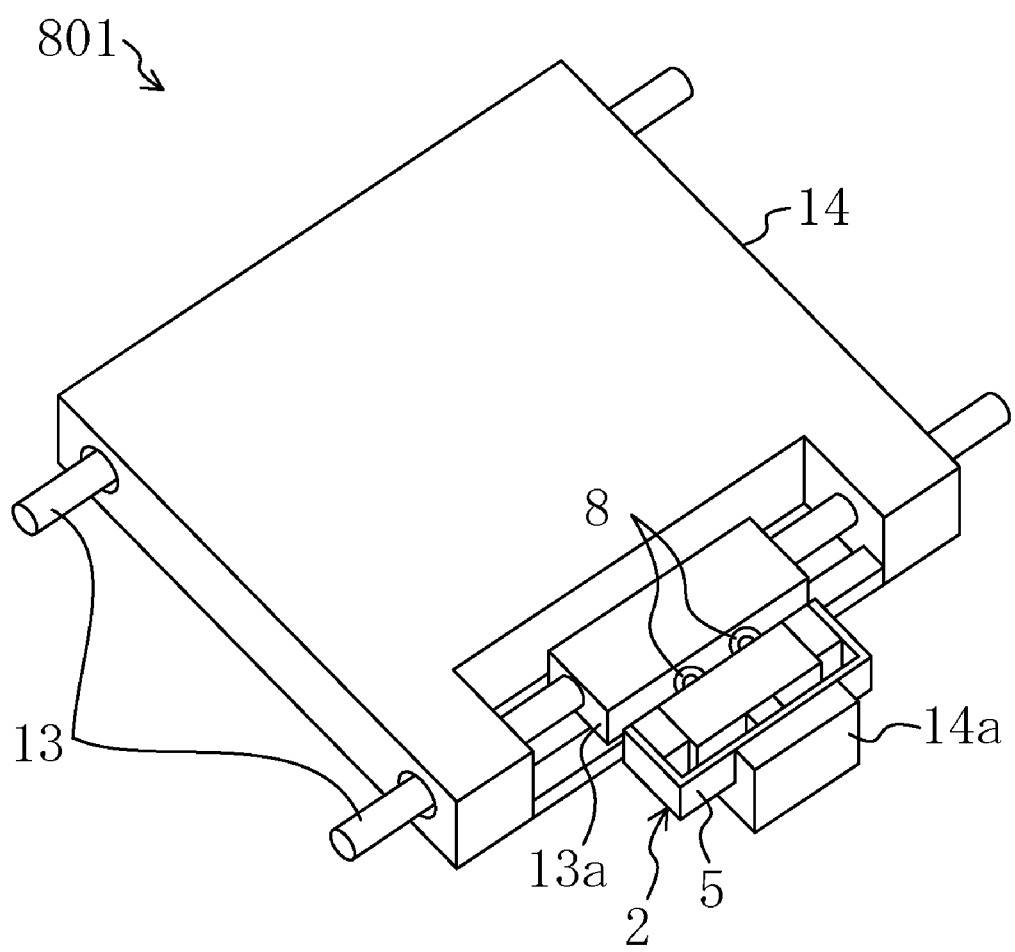
FIG. 22 is a perspective view of a drive unit according to another embodiment.

Furthermore, in the above-described embodiments, the ultrasonic actuator 2 is fixed to the base and the driver elements 8 are provided to abut on the movable stage 11 to operate the ultrasonic actuator 2, thereby driving the stage 11. However, as shown in FIG. 22, a configuration in which the ultrasonic actuator 2 is fixed to a stage may be employed. Specifically, a drive unit 801 includes guides 13 fixed to a base in parallel to one another, a stage 14 is attached to guides 13 so as to be capable of sliding, and an ultrasonic actuator 2. On one of the guides 13, an abutment member 13a is provided so as to be fixed to the guide 13. An actuator attaching portion 14a is provided on the stage 14. Moreover, the ultrasonic actuator 2 is configured so that the driver elements 8 abut on the abutment member 13a of the guide 13 and the case 5 is attached to the actuator attaching portion 14a of the stage 14. In this state, when the ultrasonic actuator 2 is operated, the driver elements 8 output driving force to the abutment member 13a. However, since the abutment member 13a is fixed, the ultrasonic actuator 2 itself is vibrated along the longitudinal direction of the guides 13 relatively to the abutment member 13a. As a result, the stage 14 connected to the case 5 via the actuator attaching portion 14a is driven along the longitudinal direction of the guides 13.

Figure 23:
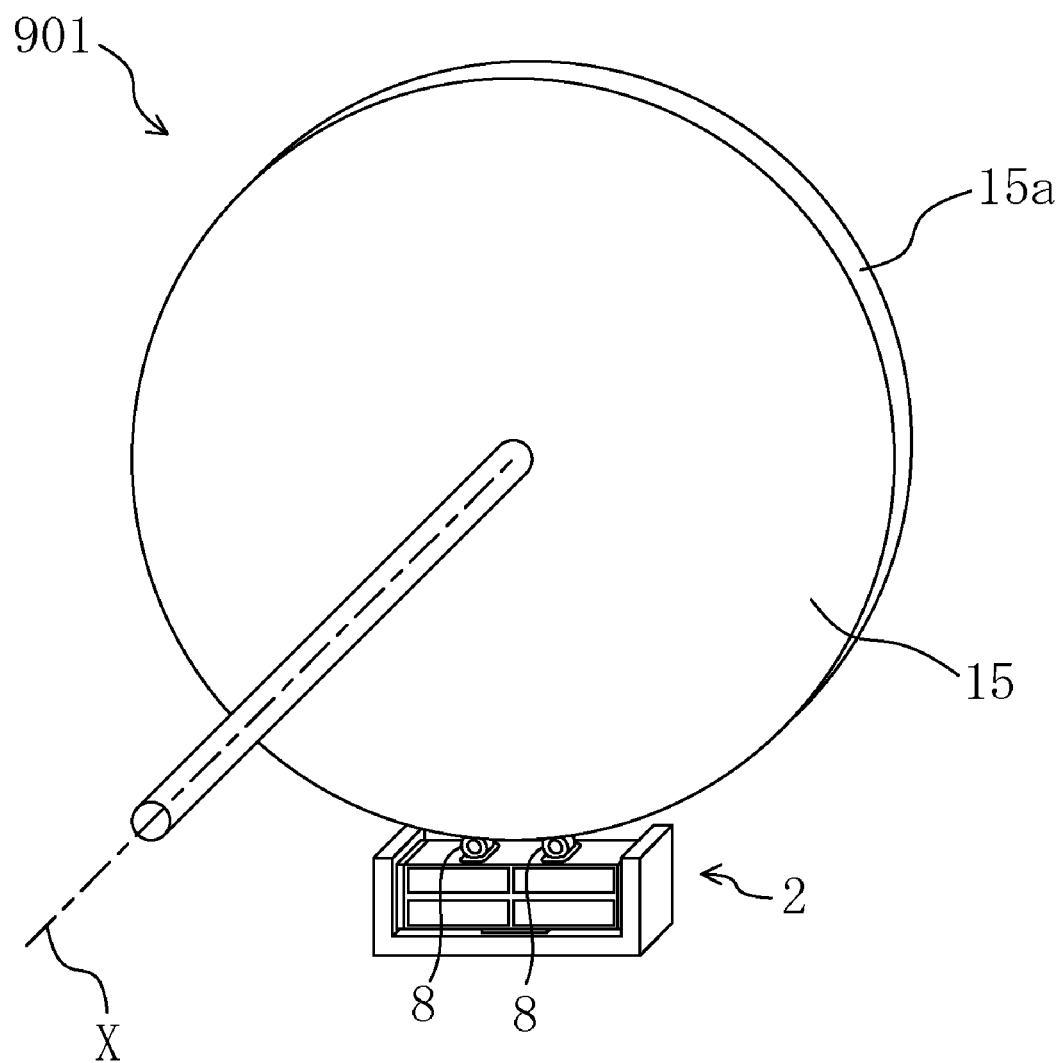
FIG. 23 is a perspective view of a drive unit according to still another embodiment.
Figure 24:
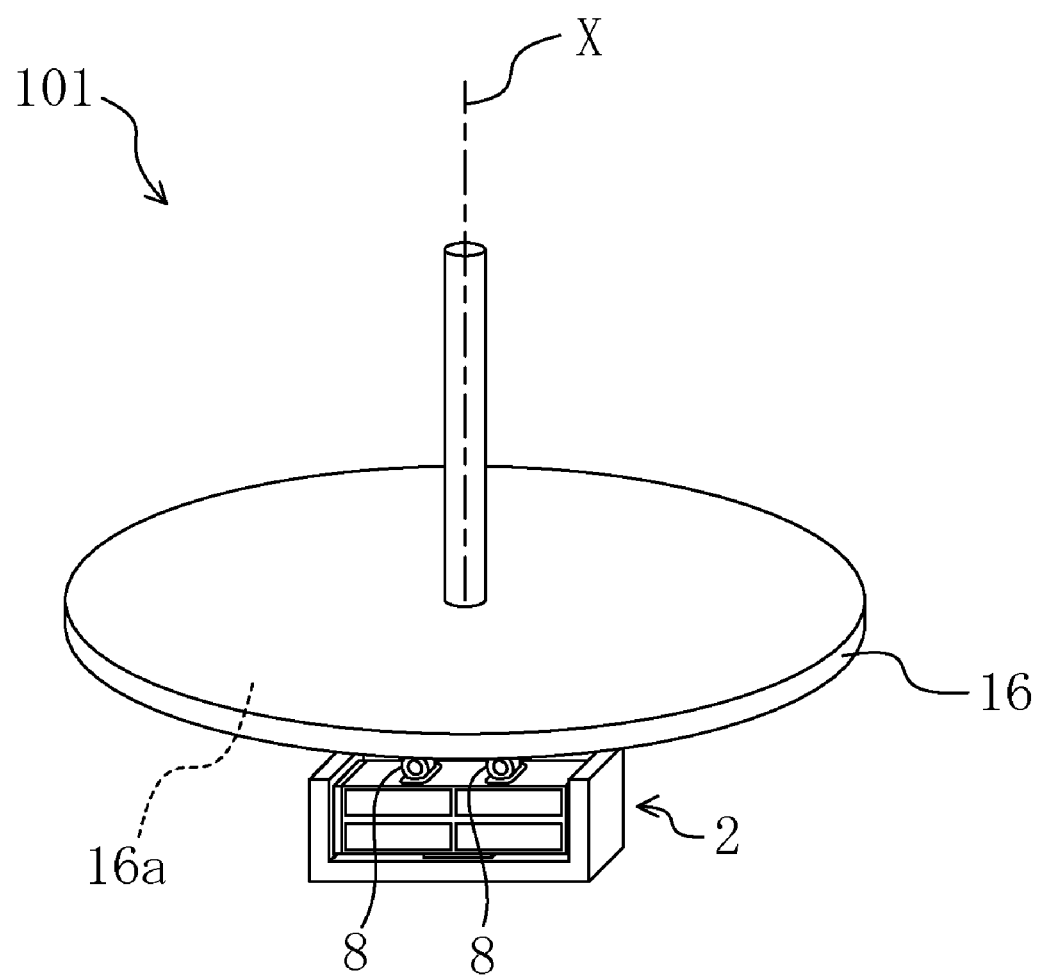
FIG. 24 is a perspective view of a drive unit according to yet another embodiment.

In the above-described embodiments, the stage 11 driven by giving driving force of the ultrasonic actuator thereto has a flat plate shape. However, the shape of the stage is not limited thereto, but any configuration may be employed as a configuration of a movable body. For example, as shown in FIG. 23, a drive unit 901 in which a circular plate body 15 capable of spinning about a predetermined axis X is a movable body and driver elements 8 of an ultrasonic actuator are configured to abut on a circumferential surface 15a of the circular plate body 15 may be employed. In such a configuration, when the ultrasonic actuator is driven, the circular plate body 15 is caused to spin around the predetermined axis X due to an approximate elliptical motion of the driver elements 8. Also, as shown in FIG. 24, a drive unit 101 in which a circular plate body 16 capable of spinning about a predetermined axis X is a movable body and driver elements 8 of an ultrasonic actuator are configured to abut on a planar portion 16a of the circular plate body 16 may be employed. In such a configuration, when the ultrasonic actuator is driven, the circular plate body 16 is driven due to an approximate elliptical motion of the driver elements 8, in a direction along a tangential direction of the circular plate body 16 at its portion on which each driver element 8 abuts, and, as a result, the circular plate body 16 spins about the predetermined axis X.

Note that the above-described embodiments are essentially preferable examples which are illustrative and do not limit the present invention, its applications and the scope of use of the invention.

INDUSTRIAL APPLICABILITY

With a vibratory actuator according to the present invention, the drive efficiency thereof can be improved, and thus, the vibratory actuator of the present invention is useful for electric devices or the like which are required to have improved efficiency.

The invention claimed is:

1. A vibratory actuator, comprising:
an actuator body, formed of a piezoelectric element or formed to include a piezoelectric element, for generating a plurality of vibrations having different vibration directions, the plurality of vibrations including at least a longitudinal vibration; and
a driver element, provided on a mounting surface which is one of side surfaces of the actuator body, for making an orbit motion according to the vibrations of the actuator body to output driving force,
wherein a reduced-material portion is provided in the driver element, and
a phase of leaning vibration of the driver element is substantially the same as a phase of vibration of the actuator body in a driving direction of the actuator body, the leaning vibration being vibration of the driver element along a direction in which the driving force is output, relative to a part of the actuator body to which the driver element is attached.

2. The vibratory actuator of claim 1, wherein
the reduced-material portion is a hole formed in the driver element.

3. The vibratory actuator of claim 2, wherein
the hole is formed so that an axis thereof extends in a parallel direction to the mounting surface.

4. The vibratory actuator of claim 1, wherein
the reduced-material portion is a notch portion formed in the driver element.

5. The vibratory actuator of claim 1, wherein
a vibration absorbing member which is non-gaseous is provided in the reduced-material portion.

6. The vibratory actuator of claim 1, wherein
the reduced-material portion is a recess portion which opens to an opposite side to the mounting surface, and
the opening end part of the recess portion is formed as an abutting portion for abutting on an abutment subject of the driver element.

7. The vibratory actuator of claim 6, wherein
the recess portion is a hole which opens to the opposite side to the mounting surface.

8. The vibratory actuator of claim 6, wherein
the recess portion is a notch portion which opens to the opposite side to the mounting surface.

9. The vibratory actuator of claim 6, wherein
an absorptive member is provided in the reduced-material portion.

10. The vibratory actuator of claim 1, wherein
the actuator body generates bending vibration and longitudinal vibration.

11. The vibratory actuator of claim 10, wherein
the mounting surface is a surface facing in a vibration direction of the bending vibration of the actuator body, and
the driver element has a spherical attaching surface to the mounting surface and is attached to the mounting surface in point contact with the mounting surface.

12. The vibratory actuator of claim 11, further comprising:
a circular body provided on the mounting surface so as to surround a contact portion of the driver element and the mounting surface,
wherein the driver element is attached to the mounting surface of the actuator body with the circular body interposed therebetween.

13. The vibratory actuator of claim 10, wherein
the mounting surface is a surface facing in a vibration direction of the bending vibration of the actuator body, and
the driver element has an attaching surface to the mounting surface, formed into a circumference surface of a circular column, and is attached to the mounting surface in line contact with the mounting surface so that an axis direction of the circular column matches an orthogonal direction to both of the vibration direction of the bending vibration and a vibration direction of the longitudinal direction.

14. A drive unit comprising:
a fixed body and a movable body capable of relative displacement; and
the vibratory actuator of claim 1, provided between the fixed body and the movable body,
wherein the vibratory actuator is configured so that the driver element abuts on one of the fixed body and the movable body and is placed on the other one of the fixed body and the movable body.

15. The drive unit of claim 14, wherein
the reduced-material portion is a recess portion which opens toward one of the fixed body and the movable body, and
the driver element abuts on the one of the fixed body and the movable body via the opening end part of the recess portion.

16. The drive unit of claim 15, wherein
a vibration absorbing member is provided in the reduced-material portion.

17. The vibratory actuator of claim 1, wherein
the reduced-material portion does not abut on an abutment body on which the driver element abuts.

* * * * *